United States Patent
Kondratyev et al.

(10) Patent No.: US 7,363,605 B1
(45) Date of Patent: Apr. 22, 2008

(54) ELIMINATING FALSE POSITIVES IN CROSSTALK NOISE ANALYSIS

(75) Inventors: Alex Kondratyev, Campbell, CA (US); Kenneth Tseng, Cupertino, CA (US); Yosinori Watanabe, El Cerrito, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 372 days.

(21) Appl. No.: 10/857,264

(22) Filed: May 28, 2004

Related U.S. Application Data

(60) Provisional application No. 60/474,712, filed on May 29, 2003.

(51) Int. Cl.
*G06F 17/50* (2006.01)
(52) U.S. Cl. .................................. 716/6; 716/4; 716/5
(58) Field of Classification Search ............. 716/6, 716/5, 4, 1
See application file for complete search history.

(56) References Cited

U.S. PATENT DOCUMENTS

| | | | |
|---|---|---|---|
| 6,373,257 B1 * | 4/2002 | Macbeth et al. | 324/536 |
| 6,510,540 B1 * | 1/2003 | Krauter et al. | 716/4 |
| 6,651,229 B2 * | 11/2003 | Allen et al. | 716/6 |
| 6,988,255 B2 * | 1/2006 | Allen et al. | 716/6 |

OTHER PUBLICATIONS

Sasaki et al., "Crosstalk Delay Analysis using Relative Window Method", 1999, IEEE.*

Chen et al., "Switching Window Computation for Static Timing Analysis in the Presence of Crosstalk Noise", Nov. 2000, ICCAD Proceddings, pp. 331-337.*

Chen et al., "On Convergence of Switching Windows Computation in Presence of Crosstalk Noise", Apr. 2002, ISPD, pp. 84-89.*

Chen et al., "Toward Tru Crosstalk Noise Analysis", 1999, IEEE/ACM International Conference Computer-Aided Design, Digest of Technical papers pp. 132-137.*

Levy et al., "ClariNet: A Noise Analysis Tool for Deep Submicron Design", Jun. 2000, Design Automation Conference, Proceddings pp. 233-238.*

Glebov et al., "False-Noise Analysis using Logic Implications", Nov. 2001, ACM International Conference on Computer-Aided Design, Digest of Technical papers pp. 515-521.*

Arunachalam et al. "TACO:Timing Analysis with Coupling", 2000, IEEE/ACM.*

Chai et al., "Temporofunctional Crosstalk Noise Analysis", Jun. 2, 2003, Design Automation Conference (DAC), Proceedings, pp. 860-863.*

Abramovici, M. et al. *Design Systems Testing and Testable Design*, IEEE Press (1994), Title page, table of contents and chapters 2-5 attached.

Devadas, S. and K. Keutzer "Synthesis of Robust Delay-Fault-Testable Circuits: Theory" *IEEE Transactions on Computer-Aided Design* (Jan. 1992) 11(1):87-101.

(Continued)

*Primary Examiner*—Sun James Lin
(74) *Attorney, Agent, or Firm*—Bingham McCutchen LLP

(57) ABSTRACT

A method for analyzing a circuit design identifies a possible noise fault for a timing interval based on a timing analysis of a victim net and at least one aggressor net of the circuit design and determines whether the noise fault is feasible based on a behavioral representation of the victim net and the aggressor net for the timing interval.

83 Claims, 12 Drawing Sheets

OTHER PUBLICATIONS

Kirkpatrick, D. and A Sangiovanni-Vincentelli "Digital Sensitivity: Predicting Signal Interaction using Functional Analysis" in *Proceedings of International Conference on Computer-Aided Design* (1996) pp. 536-541.

Lam, W. and R. Brayton *Timed Boolean Functions: A Unified Formalism for Exact Timing Analysis*, Kluwer Academic Publishers (1984), Title page, Table of Contents and Chapter 3-6 attached.

Moskewicz, M.W. et al. "Chaff: Engineering an Efficient SAT Solver" in *Proceedings of Design Automation Conference* (2001) pp. 530-535.

Xiao, T. and Marek-Sadowska "Worst Delay Estimation in Crosstalk Aware Static Timing Analysis" in *Proceedings of International Conference on Computer Design* (2000) pp. 115-120.

Xiao, T. and M. Marek-Sadowska "Functional Correlation Analysis in Crosstalk Induced Critical Paths Identification" *Proceedings of Design Automation Conference* (2001) pp. 653-656.

"User Guide" in *Celtic User Manual, Cadence Design Systems, Inc.* (2002).

"User Guide"in *Prime Time User Manual, Synopsys, Inc.* (2002).

* cited by examiner

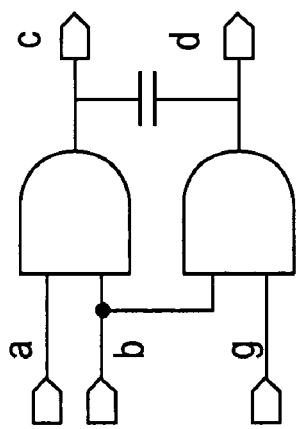
FIG. 4A
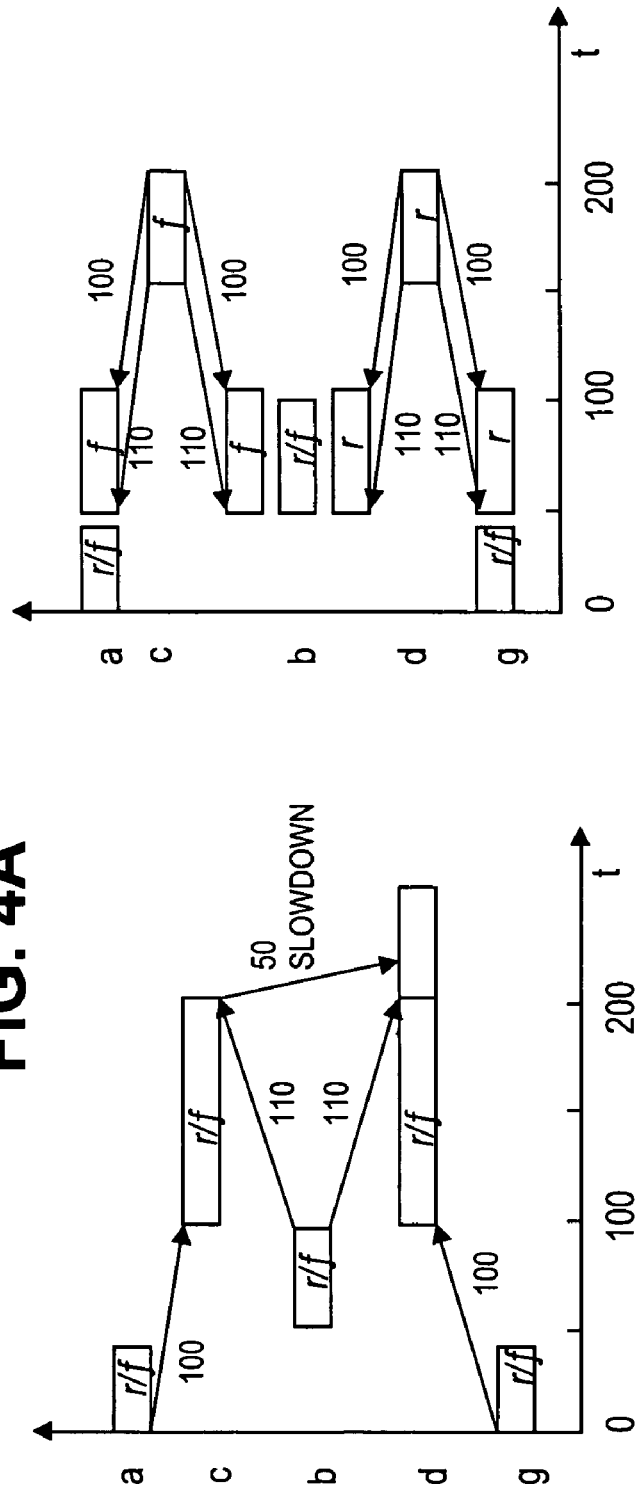
FIG. 4C
FIG. 4B

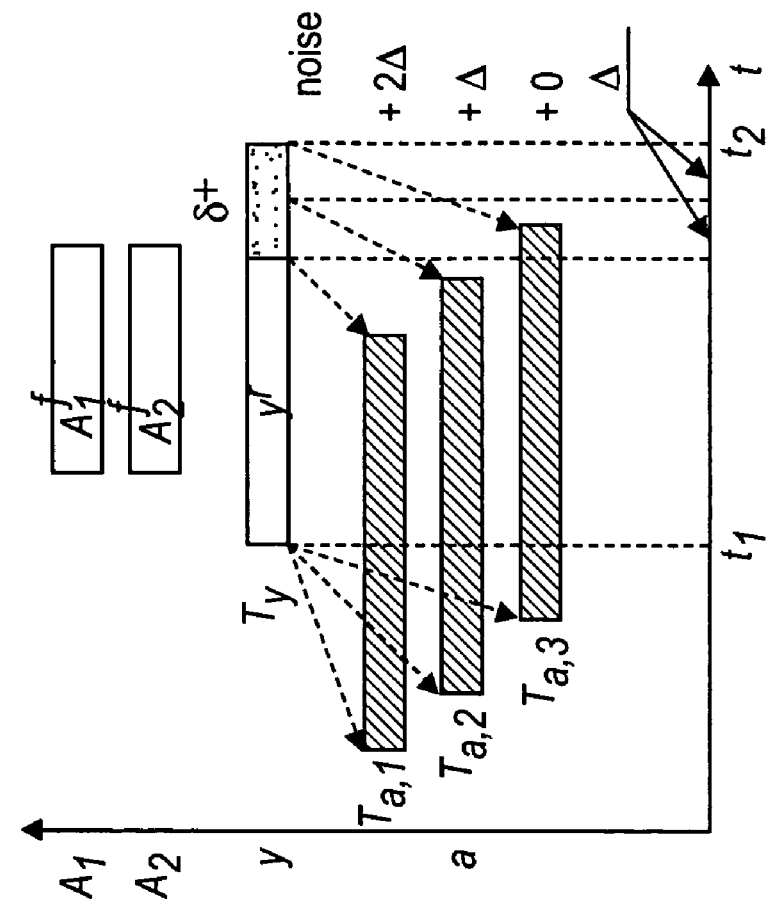
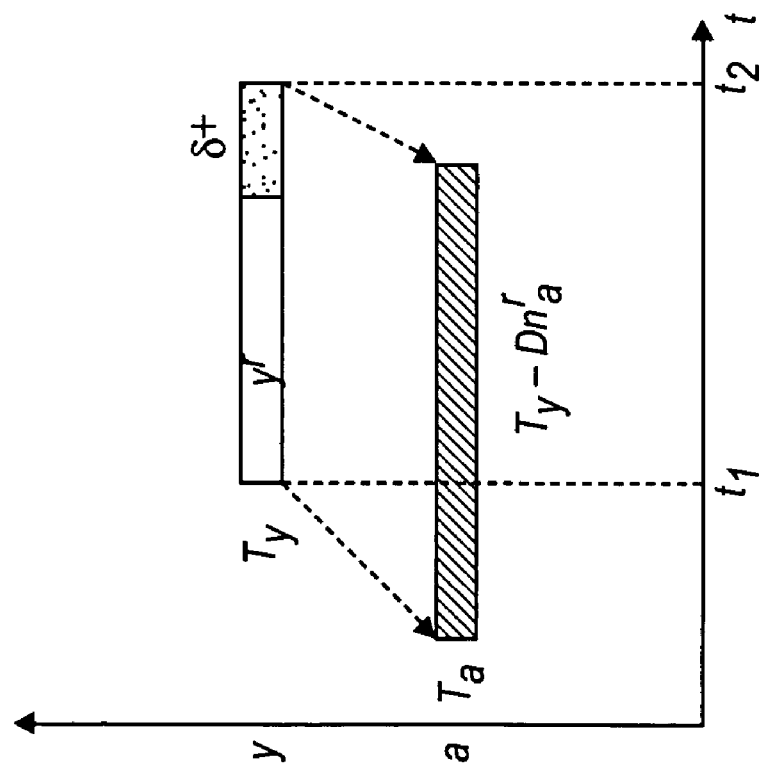
FIG. 5B
FIG. 5A

ELIMINATING FALSE POSITIVES IN CROSSTALK NOISE ANALYSIS

CROSS-REFERENCE TO RELATED APPLICATIONS

This application claims the benefit of U.S. Provisional Application No. 60/474,712, filed May 29, 2003, which is hereby incorporated by reference in its entirety.

BACKGROUND

As VLSI process technology advances, the noise problem is becoming a major issue for chip designers. If two nets are physically adjacent, one net may introduce a glitch noise to another when one is switching and the other is quiet, or a delay noise when the two nets transit at the same time in specific directions (for example, in the same direction for speedup and opposite directions for slowdown). The net affected by the noise is referred to as a victim, whereas the neighboring nets which affect it are referred to as aggressors. A crosstalk noise may cause functional failure if its induced glitch noise is incorrectly latched, or delay faults if its induced delay noise incurs timing violations.

Timing correlations between transitions in aggressor and victim nets are usually captured by switching windows obtained by static timing analysis (STA). A switching window is a time interval in which a net can make transitions. If the switching windows of an aggressor and a victim do not overlap, the aggressor cannot induce delay noise. If the switching windows of two aggressor nets do not overlap, this combination of aggressors cannot simultaneously contribute to a noise fault. Pruning by switching windows is extremely efficient because STA is of linear complexity with respect to the size of a circuit.

The simplicity of pruning heuristics comes at a cost. STA does not take into account the functional correlations between signals. Therefore the results of noise analysis based on the layout information and switching windows might be overly pessimistic. Moreover, the conventional procedures simply propagate all noises on each net to the path's end. Because of the temporal and functional correlations among the signals along a path, the probability that worst-case noises would all be summed up is generally very slight.

Prior work on using circuit functionality to reduce the pessimism in noise analysis has taken on different flavors. One conventional method observes that some signals may always transit in opposite directions, and uses such functional correlation to estimate noise delay faults in critical paths. Another exploits compatible output don't care sets to prune transitions at aggressors, leaving only those that attack victims at their care state. Another uses logic implications between nets to specify feasible switching behaviors, and form a constraint graph from which noise is estimated by finding a maximum weighted independent set of aggressors. Another conventional approach introduces a Boolean satisfiability (SAT) formulation to the noise analysis problem, which reduces the analysis to the search for two input patterns which could be successively applied to a circuit to justify the feasibility of simultaneous transitions at a chosen subset of aggressors.

However, in spite of these conventional attempts to incorporate functional correlations into noise analysis, a general and practically viable solution to this problem is still lacking in the conventional methods, because they impose over-simplified assumptions about the delay models (like fixed delays) or about the captured functional correlations.

SUMMARY

A method for analyzing a circuit design identifies a possible noise fault for a timing interval based on a timing analysis of a victim net and at least one aggressor net of the circuit design and determines whether the noise fault is feasible based on a behavioral representation of the victim net and the aggressor net for the timing interval.

BRIEF DESCRIPTION OF THE DRAWINGS

FIGS. 4(a), 4(b), and 4(c) show an example of a circuit that uses back propagation of delays to remove false positive noise.

FIGS. 5(a) and 5(b) show examples of back propagation of delay interval models.

DETAILED DESCRIPTION

A method for eliminating false positives in crosstalk noise analysis provides a general approach to deal with feasible crosstalk-induced noise of a circuit by modeling delays at a node with timing intervals that distinguish between rising and falling transitions of a signal at the node. The intervals are used to represent the behavior of the signal at the node with multi-valued Boolean logic. A satisfiability (SAT) formula is constructed with the multi-valued Boolean logic expressions to capture functional correlations of circuit elements. By checking to see whether the SAT formula is satisfiable on the interested circuit, which may be a net, path or endpoint, for example, the method determines whether the corresponding crosstalk noise is feasible. To provide a trade-off between accuracy and runtime, methods for performing net-, path- and cone-based noise analysis can be modified. For example, a net-based noise feasibility analysis is fast but may be too pessimistic since it does not consider the noise induced in the fan-in stages of the nets of interest. Also, a path (or cone)-based analysis takes all the correlations between the stages among a fan-in cone into account and thus results in conservative, but much less pessimistic, analysis.

Worst-Case Noise Analysis

The worst-case crosstalk-induced noises, which do not take functional correlations into account, are obtained using a commercial noise analyzer, such as CeltIC available from Cadence Design Systems of San Jose Calif. for example. The tool generates refined switching windows which are padded by worst-case slowdowns/speedups and reports the noisy nets and paths. An incremental router is capable of removing those signal integrity problems.

Figure 1:
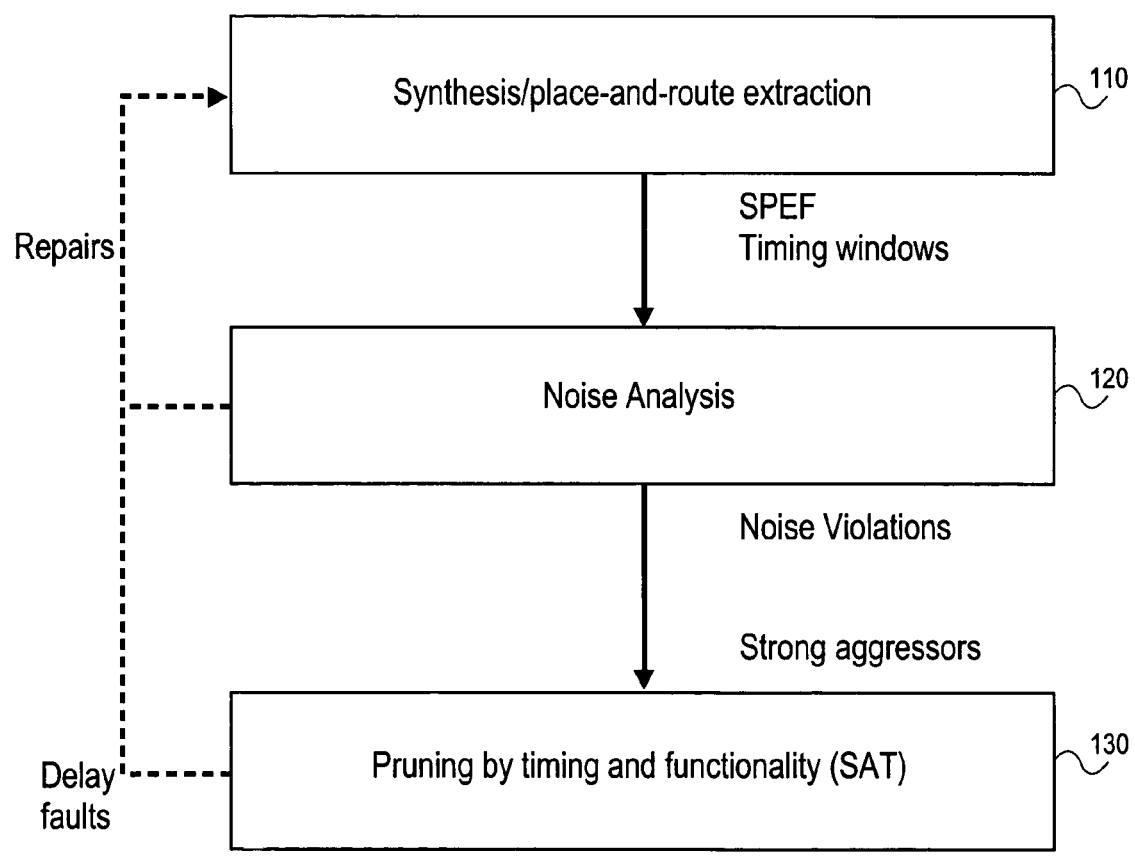
FIG. 1 shows an example of a method for eliminating false positives in crosstalk noise analysis.

FIG. 1 shows an example of a method for performing noise analysis to reduce or eliminate false positives in crosstalk noise analysis. A router synthesizes a netlist and provides the netlist to the noise analyzer, 110. The analyzer performs a noise analysis of the circuit design, 120.

During the noise analysis, a timing analysis is performed, so that switching windows of strong aggressors can be checked to determine the worst-case aggressor subset and their worst-case alignments to the victim's transition. For example, given an extracted netlist, the noise analyzer first finds an aggressor set for every net. Although a net might be impacted by many neighboring nets, it often has a small set of strong aggressors (usually fewer than 5) which are capable of injecting noise exceeding a pre-defined threshold. The other (weak) aggressors cannot be ignored because their combined effect could be significant even though their individual impacts are small. In the noise analyzer, the impact of weak aggressors can be modeled by a single "virtual" aggressor that is computed using weighted lumped approximations.

Once the worst aggressor subset is determined, a noise delay analysis is performed. For example, the amount of noise injected from every aggressor, and its alignment offset to the victim, are estimated using reduced order modeling methods. The total delay change (slowdown or speedup) is calculated using a single fast circuit simulation that considers the non-linear combined effects of the selected aggressors to the victim's transition. Glitch noise analysis is similarly performed except that no victim's transition needs to be considered.

The timing analysis and the crosstalk delay analysis are mutually dependent. On one hand, crosstalk-induced delay noises depend on the arrival times and slew rates of signals. On the other hand, switching windows should take into account possible slowdowns or speedups due to crosstalk-induced delay noises. This dependency is resolved by performing iterations between delay analysis and timing analysis during the noise analysis. For every net with a set of aligned aggressors, the noise analyzer finds the worst-case noise (functional or delay) by a fast circuit simulation. The delay noise is then back-annotated to a timing engine and switching windows of nets are updated. The updated switching windows are then used to re-calculate the noises. It usually takes a few iterations to converge.

The noisy switching windows obtained from the noise analysis provide a worst-case estimation of noise impacts. This estimation is pessimistic because it assumes the worst possible alignment between a victim and its aggressors, it ignores any functional correlations between aggressor and victim transitions, and it merely adds up the worst noise from all preceding stages of a net.

A post-process analysis is performed to improve the results of the worst case analysis produced by 120. An additional pruning of the faults reported by the noise analysis is performed, 130, by considering a unified timing and functional behavior of the signals in the circuit design. This analysis takes into account the functional correlations between aggressor and victim transitions, non-worst case alignments between a victim and its aggressors, and non-worst case noise from preceding stages of the net. The unification of functional and temporal correlations is done by projecting the behavior of physical signals into the domain of timed-Boolean variables. For given nets, a SAT formula is generated to check whether a given scenario for speedup or slowdown (in case of delay faults) or for glitch (in case of functional faults) is feasible. A scenario may be provided by the worst case analysis 120. If the formula is unsatisfiable, the reported noise fault is infeasible. In such a case, the set of aggressors is pruned, and the worst case among the remaining feasible scenarios and the corrected values for noise faults are reported.

Functionality and Timing

To perform the false positive reduction method, functionality and timing are represented in a unified way using an interval delay model, which increases the accuracy of a circuit-behavior description over a zero-delay model or a fixed delay model. The reduction of false positives in the crosstalk noise analysis can then be performed using the delay interval representations.

A. Zero-Delay Model

In the zero-delay model, all the gates and interconnects are assumed to have zero delay. This model captures only stationary states of the circuit before and after all transitions occur. The rationale behind the zero-delay model lies in the fact that for considering delay faults (maximal slowdown e.g.) only the last transition propagated through a critical path matters. This transition sets all gates to their stationary values, which can then be analyzed within the zero-delay model. However one can see that zero-delay analysis is simultaneously optimistic and pessimistic. It is optimistic because it completely ignores possible hazards in a circuit. Stationary analysis tends to under-estimate the switching activity in a circuit, and so the amount of the reported noise delay may seem smaller than it actually is. On the other hand, a zero-delay model assumes that all aggressors are switching at the very same time (namely at time 0) which is not usually the case because of timing dependencies between their transitions. However, an analysis based solely on the zero-delay model shows little consistency with the one that takes timing into account.

B. Fixed Delay Model

In the fixed delay model, all the pin-to-output delays of a gate are assumed to have the same single-value. Timing is introduced into Boolean reasoning through the use of timed-Boolean functions and timed-Boolean variables. For finer consideration of timed behavior, multi-value logic is used. A multi-value timed variable $a_t$ may be encoded by the set of Boolean variables $a_t^v$, where subscript t points at a considered moment of time, while superscript v stands for the value of a ($a_t^v=1$ means that the variable a takes value v at the time moment t). (In this example, time is denoted as a subscript and value is denoted as a superscript of a Boolean variable.)

For example, given a time point t, the behavior of a circuit node a can be described using four-value timed-Boolean logic as $a_t^0$, $a_t^1$, and $a_t^f$ for a having steady value of '0' or '1', or making rising or falling transition at t. Using four-value timed-Boolean logic, the relations between the signals at the inputs and the output of every gate can be easily described. Table I shows an example for a 2-input AND gate y=ab, where d is the pin-to-output delay. Note that an additional value $y^u$ is introduced and corresponds to an "undefined"

situation to cope with the ambiguity of the AND gate behavior when its inputs perform transitions in the opposite directions.

TABLE I

Functionality of AND gate y = ab

| | $a_t^r$ | $a_t^f$ | $a_t^1$ | $a_t^0$ |
|---|---|---|---|---|
| $b_t^r$ | $y_{t+d}^r$ | $y_{t+d}^u$ | $y_{t+d}^r$ | $y_{t+d}^0$ |
| $b_t^f$ | $y_{t+d}^u$ | $y_{t+d}^f$ | $y_{t+d}^f$ | $y_{t+d}^0$ |
| $b_t^1$ | $y_{t+d}^r$ | $y_{t+d}^f$ | $y_{t+d}^1$ | $y_{t+d}^0$ |
| $b_t^0$ | $y_{t+d}^0$ | $y_{t+d}^0$ | $y_{t+d}^0$ | $y_{t+d}^0$ |

From Table I the following functions are obtained:

$$y_{t+d}^1 = a_t^1 b_t^1$$

$$y_{t+d}^0 = a_t^0 + b_t^0$$

$$y_{t+d}^r = a_t^r b_t^r + b_t^r a_t^1 + a_t^r b_t^1$$

$$y_{t+d}^f = a_t^f b_t^f + a_t^f b_t^1 + b_t^f a_t^1 \quad (1)$$

C. Interval Delay Model and Logic of Intervals

The fixed delay model is overly optimistic for deep submicron designs. Delays may vary significantly due to process variation, IR drop, or crosstalk noise. Because of delay variability it is not possible to tell exactly which behavior pattern (keeping steady values or switching) a signal might have at a certain moment of time. To overcome this, signal behavior at a node is specified by intervals rather than by discrete moments of time. In the interval delay model, both gate delay and interconnect delay are represented as intervals. In this description, the terms interval and window are used interchangeably to refer to a continuous time region bounded by two numbers $t_1$ and $t_2$ with $t_1 \leq t_2$.

For a wire y in time interval $$T = [t_1, t_2],$$

four timed-Boolean variables $y_T^0$, $y_T^1$, $y_T^r$, $y_T^f$ are introduced that indicate whether the wire is low, high, rising, or falling, respectively at some time in $[t_1$ and $t_2]$. The boundary between logical values '0' and '1' is defined by the $V_{dd}/2$ voltage level. The expression $$y_T^r (y_T^f)$$

is true if there exists a pair $$t_a, t_b \in T : t_a < t_b$$

such that $$y_{t_a}^0 = y_{t_b}^1 = 1 (y_{t_a}^0 = y_{t_b}^1 = 1).$$

Figure 2:
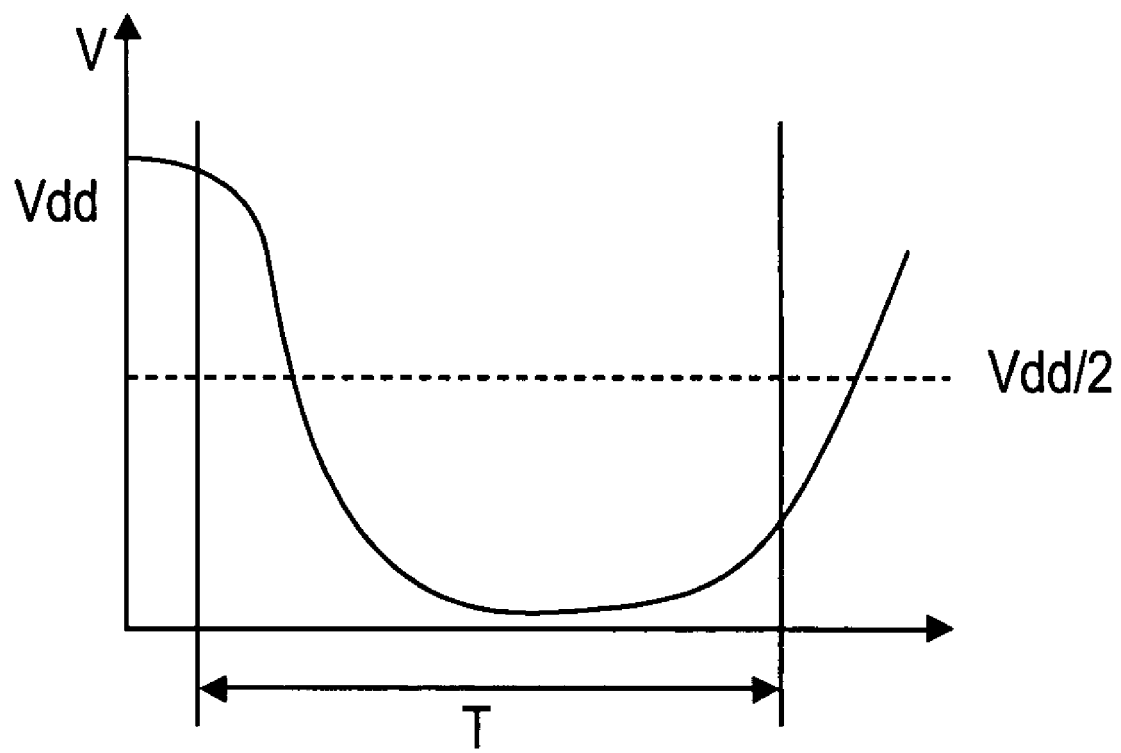
FIG. 2 shows an example of a signal that is modeled based on intervals of delay.

In FIG. 2, the behavior of a signal y is described by the following set of variables:

$$y_T^0 = y_T^1 = y_T^f = 1 \text{ and } y_T^r = 0.$$

In general, $$y_T^r = 1 \text{ or } y_T^f = 1$$

implies that $$y_T^0 = y_T^1 = 1$$

(i.e. $y_T^r(y_T^f) \Rightarrow y_T^0 y_T^1$).

Both $y_T^1$ and $y_T^f$ are equal to 1 when there is more than one transition (glitch) in T (i.e. $y_T^r y_T^f \neq 0$).

Unlike the fixed delay model, the interval delay model has variables $y_T^0$, $y_T^1$, $y_T^r$, $y_T^f$ that are no longer orthogonal. Strictly speaking, they are considered as separate Boolean variables rather than as an encoding of a single multi-value variable $y_T$.

The interval arithmetic then is defined as:

$$T_1 = [t_x, t_y]$$

$$T_2 = [t_a, t_b]$$

$$T_1 \pm d = [t_x \pm d, t_y \pm d]$$

$$T_1 + T_2 = [t_x + t_a, t_y + t_b]$$

$$T_1 - T_2 = [t_x - t_b, t_y - t_b]$$

$$T_1 \cup T_2 = [\min(t_x, t_a), \max(t_y, t_b)]$$

$$T_1 \cap T_2 = [\max(t_x, t_a), \min(t_y, t_b)]$$

$$T_1 = \emptyset, \text{ if } t_x > t_y$$

D. Interval Logic Propagation Through a Gate

The purpose of incorporating functionality is to determine whether a set of nodes will not switch during a particular time interval. Since this analysis examines switching activity at internal nodes, timing information is propagated backward via a time analysis, along with the functionality information. A result for the backward propagation is derived by considering the conditions of gate sensitization. Let us consider a single AND gate, $$y = ab.$$

From a library characterization, the pin-to-output fall (rise) delay for input a to output y of a gate is given as an interval $$D_a^f = [d_{a,min}^f, d_{a,max}^f](D_a^r = [d_{a,min}^r, d_{a,max}^r]),$$

and the pin-to-output fall (rise) delay for input b is given as an interval $$D_b^f = [d_{b,min}^f, d_{b,max}^f](D_b^r = [d_{b,min}^r, d_{b,max}^r]).$$

Figure 3:
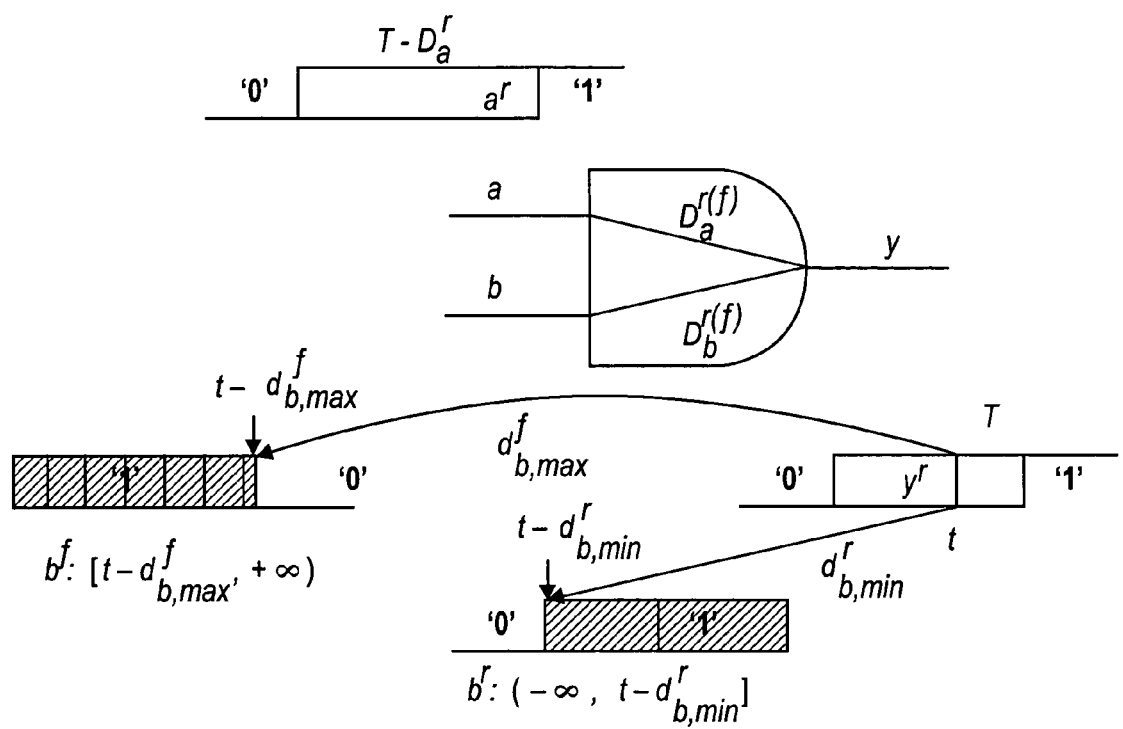
FIG. 3 shows an example of a delay model for a gate based on back propagation of an interval delay model.

As an example, consider how to propagate $$y_T^r (T = [t_1, t_2])$$

backward, in particular assuming that a rises. First, assuming b keeps a non-controlling value '1' through any possible transition of a, then $y_T^r$ requires $a_{T-D_a^r}^r$. Then, determine the least stringent condition for b to be '1' to allow the transition of a to be propagated to y in T. To derive the time interval when b has to be '1', consider two different scenarios related to a transition at y at a time point t∈T, as shown in FIG. 3:

First, a rising transition of b happens not later than $(t - d_{b,min}^r)$ (i.e., the allowable rising interval for b is $(-\infty, t - d_{b,min}^r]$). In this case, the value '1' obtained after the rising transition at b (under the most optimistic case using minimal delay $d_{b,min}^r$) can allow the transition of a to be propagated to y at t, or Second, a falling transition of b happens not earlier than $(t - d_{b,max}^f)$ (i.e., the allowable falling interval for b is $[t - d_{b,max}^f, +\infty)$). In this case, the value '1' at input b obtained before the falling transition (under the most pessimistic case using maximal delay $d_{b,max}^f$) can allow the transition of a to be propagated to y at t.

Let $$T_{int}(-\infty, t-d_{b,min}^r] \cap [t-d_{b,max}^f, +\infty) = [t-d_{b,max}^f, t-d_{b,min}^r].$$

If $$T_{int} \neq \emptyset \text{ (e.g. } d_{b,min}^r \leq t-d_{b,max}^f), b_{T_{int}}^1 = 1$$

(where '1' is a rising, falling, or steady '1') satisfies either scenario (1) or (2). If $$T_{int} = \emptyset \text{ (e.g., } d_{b,min}^r > d_{b,max}^f),$$

the occurrence of either scenario (1) or (2) implies that b is a steady '1' in the interval $$[t-d_{b,min}^r, t-d_{b,max}^f]$$

(after any rising transition or before any falling transition). Combining these two cases and extending them to the interval T, gives the time interval $T_b^1$ for b having to be at value '1' to allow a transition at y to occur in T, $$T_b^1 = \begin{cases} T - [d_{b,\min}^r, d_{b,\max}^f], & \text{if } d_{b,\min}^r \leq d_{b,\max}^f \\ T - [d_{b,\max}^f, d_{b,\min}^r], & \text{if } d_{b,\min}^r > d_{b,\max}^f \end{cases}$$

$$= T - [\min(d_{b,\min}^r, d_{b,\max}^f), \max(d_{b,\min}^r, d_{b,\max}^f)].$$

Then the Boolean condition for y rising in T when a makes a rising transition can be derived as $$y_T^r = a_{T-D_a^r}^r b_{T_b}^1.$$

(To be more precise, a distinction is made between two different cases. In the case of $d_{b,min}^r \leq d_{b,max}^f$, then $b_{T_b}^1$ is true and in the case of $d_{b,min}^r > d_{b,max}^f$, then $\overline{b_{T_b}^1}^0$ is true, which are the conditions for b to be a steady '1' in $T_b^1$. For clarity, $b_{T_b}^1$ is used instead here and after.)

In a similar fashion, the time interval $T_b^0$ for b to be controlling value '0' to make '0' at y to occur in T can be derived by also considering two scenarios for y being '0' at a time point $t \in T$: a rising transition happens at b not earlier than $t-d_{b,max}^r$ and a falling transition happens at b not later than $t-d_{b,min}^f$.

$$T_b^0 = T - [\min(d_{b,min}^f, d_{b,max}^r), \max(d_{b,min}^f, d_{b,max}^r)].$$

The full set of constraints combining timing and functionality for the function $$y = ab$$

are given below, where $T_a^1(T_a^0)$ is defined on a similarly as $T_b^1(T_b^0)$ on b.

$$y_T^1 = a_{T_a}^1 b_{T_b}^1$$

$$y_T^0 = a_{T_a}^0 + b_{T_b}^0$$

$$y_T^r = a_{T-D_a^r}^r b_{T_b}^1 + b_{T-D_b^r}^r a_{T_a}^1$$

$$y_T^f = a_{T-D_a^f}^f b_{T_b}^1 + b_{T-D_b^f}^f a_{T_a}^1 \quad (2)$$

With implication $$y_T^r(y_T^f) \Rightarrow y_T y_T^1,$$

equations (2) fully coincide with (1) where delay interval $D_a^r(D_a^f)$ and $D_b^r(D_b^f)$ are reduced to a single value d.

The set of equations (2) could be generalized for an arbitrary gate function $y = F(x_1, \ldots, x_n)$ by introducing the untimed-to-timed variable transformation operator $\mathcal{T}(T, F)$.

This operator takes as an input two components: a required time interval T and a Boolean function F. Applying $\mathcal{T}$ results in every literal in F being replaced by a corresponding Boolean variable annotated with a timed interval according to the following rules:

$$\mathcal{T}(T, x) = x_{T_x}^1 \quad (3a)$$

$$\mathcal{T}(T, \overline{x}) = x_{T_x}^{0^-} \quad (3b)$$

where $T_x^1(T_x^0)$ are derived from T as discussed above. With the help of $\mathcal{T}$ the functions $y_T^1$ and $y_T^0$ can be represented as follows:

$$y_T^1 = \mathcal{T}(T, y) \quad (4a)$$

$$y_T^0 = \mathcal{T}(T, \overline{y}) \quad (4b)$$

Let Sup(y) defines a support of function y. $y_T^r$ and $y_T^f$ can be determined using Boolean difference to check sensitization conditions as follows:

$$y_T^r = \sum_{x \in Sup(y)} \left( x_{T-D_\infty^r}^r \mathcal{T}(T, \overline{y}_x y_x) + x_{T-D_x^f}^f \mathcal{T}(T, \overline{y}_x y_{\overline{x}}) \right) \quad (4c)$$

$$y_T^f = \sum_{x \in Sup(y)} \left( x_{T-D_x^r}^r \mathcal{T}(T, y_x \overline{y}_x) + x_{T-D_x^f}^f \mathcal{T}(T, y_x \overline{y}_{\overline{x}}) \right) \quad (4d)$$

Where $y_x$ denotes the cofactor of y with respect to x and $D_x^r(D_x^f)$ is the rise (fall) delay from input x to the gate output. The product $\overline{y}_x y_x (\overline{y}_x y_{\overline{x}})$ shows that function y rises along with the rising (falling) transition of x and the product $y_{\overline{x}} \overline{y}_x (y_x \overline{y}_{\overline{x}})$ shows that function y falls along with the rising (falling) transition of x.

It is easy to check that applying formula (4a-d) to function y=ab one would generate the set of constraints that coincide with the ones from (2).

Required Time Analysis with Noise

The worst-case noise analysis determines the maximum possible slowdown/speedup that might occur at net transitions because of crosstalk. After the worst-case analysis is done, two arrival switching windows are obtained for every net y: the nominal (noise-free) switching window $$sw(y) = [e_y; l_y]$$

and the noisy switching window $$sw^n(y) = [e_y^n, l_y^n]$$

which is padded by the amount of slowdown (denoted by $\delta^+(y)$) and speedup (denoted by $\delta^-(y)$) noise on y.

A noise analysis that reduces false positives can be performed by checking to see whether a set of specified transitions at aggressors and a victim (both in terms of timing and direction) are feasible. The latter may be performed using a timing analysis technique in which signal transitions are propagated backward from primary outputs to primary inputs. This is performed by constructing a formula of timed-Boolean variables in Conjunctive Normal Format (CNF) to represent timed functionality. This formula is then checked using a SAT solver.

The backward propagation terminates either at primary inputs (PIs) or at register outputs (PPIs). These points are characterized by arrival time windows with at most one transition per window. The single transition at each PI/PPI is a reasonable assumption for a synchronous methodology, which corresponds to a transition mode analysis in which two input vectors are applied to a circuit, one at t=−∞ and another at t=0. Solving the formula shows whether the specified transitions at the victim and the aggressors are sensitized at PIs and PPIs, and if the answer is "yes" then the considered noise is feasible.

A. ILLUSTRATIVE EXAMPLE

Consider an example of a circuit from FIG. 4(a). For simplicity of illustration, the following assumptions are made about this circuit: First, all pin-to-output delays for AND gates are equal, such that:

$$D_a^r = D_a^f = D_b^r = D_b^f = D_g^r = D_g^f = [100 \text{ ps}, 110 \text{ ps}]$$

Second, wire delays are neglected. Third, arrival time windows for primary inputs a, g and b are [0, 40 ps], [0, 40 ps] and [50 ps, 100 ps] respectively. Also, an aggressor c has a zero offset alignment with victim d, and their coupling contributes to a 50 ps slowdown ($\epsilon^+$) at d.

FIG. 4(b) shows an example of a procedure for performing noise analysis. Arrival time windows (represented by hollow rectangles) are propagated forward (shown by dashed arcs with delay value annotations) without taking into account circuit functionality (the transitions could be rising or falling, r/f). As a result, the falling window for aggressor c overlaps with the rising window for victim d, and the slowdown of 50 ps on d (shown by the shaded region) is deducted as feasible.

The required transitions at the victim and its aggressors are propagated backward, as shown in FIG. 4(c), and a set of required transitions at primary inputs and register outputs (PI/PPIs) is obtained. For example, based on the results of the worst-case analysis from FIG. 4(b), for the noise to occur to d, the net c has to have a falling transition while the signal on d is rising. To determine whether this situation can occur, the falling transition of net c is propagated back to inputs a and b, to determine that when inputs a and b are falling, they will produce a falling signal at the output c. Also, the rising transition of d is propagated back to determine that inputs b and g will produce a rising signal at output d when the inputs are both rising. Because input b must be rising at the same time that it is falling, the worst-case noise is not feasible.

In general, to determine the feasibility of a noise violation, the CNF formula is used to see whether the worst-case scenario is indeed feasible. Based on specified arrival time windows for each PI/PPI and the single-transition assumption, the formula is used to determine whether the required transitions at PI/PPIs are satisfiable, and whether they can produce a noise delay of 50 ps. As shown in FIG. 4(c), the process determines whether a signal can rise at d in

[210,210+$\delta^+$], which is reported by worst-case noise analysis with the aggressor c inducing slowdown noise $\delta^+$ on d. This requires that signal rises at d in

[210$\delta^+$,210]

without considering crosstalk noise. Meanwhile, c induces slowdown noise $\delta^+$ at this interval. As a result, the process determines whether the occurrence of c falling and d rising at

[210−$\delta^+$,210]=[160,210]

are feasible, that is, it determines whether $c_{[160,210]}^f$ $d_{[160,210]}^r = 1$ is satisfiable.

The required falling and rising intervals at the victim d and the aggressor c are propagated backward to their inputs (shown by dashed arcs with delay-value annotations), respectively. The propagated intervals and signal values are obtained by applying equations (2) to $c_{[160,210]}^f$ and $d_{[160,210]}^r$.

The required time windows for inputs a and g do not overlap with their arrival time windows (represented by hollow rectangles) and therefore the required transitions for a and g cannot happen within the backward-propagated windows. The windows propagated to input b from d and c do overlap with the arrival time window for b but imply the opposite transitions on b. This contradicts the single-transition assumption for primary inputs and shows that the considered worst-case timing is infeasible.

B. BACKWARD PROPAGATION OF INTERVALS

When constructing a timed-Boolean formula for a circuit behavior using logic of intervals and backward window propagation, there are two ways to take noise delays into account. The first method presents a straightforward extension of the required time analysis in which a noise impact is taken into account by including worst-case noise values into pin-to-output delays. This is efficient from the stand point of complexity but provides little room for an accurate analysis of noise sources. Another method, called refined noise propagation, focuses on increasing the accuracy of noise analysis at the expense of more complicated computations. With these methods of noise analysis, accuracy can be balanced with efficiency of computation by using a refined noise propagation only for some parts of a circuit, such as critical parts for example, while the analysis for rest of the circuit can be approximated by the worst-case propagation.

1) Worst-case noise propagation: Backward propagation is performed using noisy switching windows and modified pin-to-output delays, which include worst-case noise values. Let the rising transition at input pin a cause the rising transition at the output y. If the nominal pin a to output y rise delay (noise-free) is given as an interval $$D_a^r = [d_{min}^r, d_{max}^r],$$

then for the worst-case noise propagation, this interval is modified as $$Dn_a^r = D_a^r + \Sigma, \text{ where } \Sigma = [-\delta^-(y), \delta^+(y)].$$

$Dn_a^r$ defines noisy pin-to-output delays which are used to propagate intervals backward. An example of analyzing noise slowdown using back propagation is illustrated in FIG. 5(a) where a switching interval $$T_y = [t_1; t_2],$$

which includes the slowdown noise $\delta^+(y)$, is backward propagated to the input a and generates a required switching interval $$T_a = T_y - Dn_a^r$$

for a (speedup noise is ignored in this example). The solid arcs correspond to delay with noise.

2) Refined noise propagation: In this case, the amount of noise that is feasible on the nets of interest is considered. Furthermore, the signal arrival time that is feasible in the presence of noise is considered. Considering a slowdown case, for a signal to arrive at net y in time interval $$T_y = [t_1; t_2],$$

the signal can arrive at an interval $$T_y - \delta$$

plus extra slowdown noise $$\delta \in [0, \delta^+(y)]$$

induced during that interval. As a result, different arrival time intervals $T_a$ at a fanin a of y are required depending on how much slowdown noise is obtained from y. It ranges from $$T_a = T_y - D_a^r$$

when no noise occurs to $$T_a = T_y - \delta^+(y) - D_a^r$$

with the worst-case noise. The refined consideration of noise delays takes into account functional conditions under which a certain amount of noise is feasible. This is done through discretizing $\delta^+(y)$ with a pre-defined step $\Delta$, and deriving Boolean conditions for the feasibility of every interval.

The idea of the refined noise propagation is illustrated by FIG. 5(b). By choosing a discretization step $$\Delta = \delta^+(y)/2,$$

three intervals for a victim y are considered:

$$T_1 = [t_1 - 2\Delta, t_2 - 2\Delta],$$

$$T_2 = [t_1 - \Delta, t_2 - \Delta], \text{ and}$$

$$T_3 = [t_1, t_2].$$

These intervals are propagated backward to input a using pin-to-output delays $D_a^r$ (shown by dashed timing arcs) giving rise to propagated intervals $T_{a,1}$, $T_{a,2}$ and $T_{a,3}$.

Suppose that slowdown $\delta^+(y)$ is induced by falling transitions at aggressors $A_1$ and $A_2$ which have equal couplings and zero offset alignment with y. Then the Boolean conditions for rising transition at y happening in intervals $T_1$; $T_2$ and $T_3$ are, respectively, $$B_{2\Delta} = A_{1,T_1}^f A_{2,T_1}^f$$

(both aggressors are required to switch to provide a $\delta^+ = 2\Delta$ slowdown), $$B_\Delta = A_{1,T_2}^f + A_{2,T_2}^f$$

(at least one aggressor is required to switch to provide a $\Delta$ slowdown) and $$B_0 = 1$$

(with no noise, no aggressor is required to switch).

In general, for a given maximal slowdown $\delta^+(y)$ of a rising transition at net y, the discretization step $\Delta$ and the interval $T_y = [t_1; t_2]$, one could describe the timed behavior of y as:

$$y_{T_y}^r = \sum_{j=0}^{k} y_{T_y - \delta_j}^r B_{\delta_j}, (\delta_j = \delta^+(y) - j \times \Delta) \quad (6)$$

Where the maximal noise $\delta^+(y)$ is discretized into k regions with a step $\Delta$. Formula (6) explicitly distinguishes the delay components of y with different levels of induced noise: starting from the maximal slowdown $\delta^+(y)$ when all aggressors impact y ($B_{\delta^+(y)} = 1$) to no aggressor impacting y ($B_0 = 1$).

The idea of deriving $B_{\delta_i}$ lies in binning all possible subsets of strong aggressors by the amount of contributed noise at net y. For that, the noise contribution from each aggressor is approximated by scaling the total noise determined by a circuit simulation in one stage according to a coupling capacitance between an aggressor and the victim, $$\text{noise}_i = (Cc_i / Cc_{total}) \times \text{noise}_{total} \quad (7)$$

where $Cc_i$ is the coupling capacitance between aggressor i and the victim, $Cc_{total}$ is the total coupling capacitance for all aggressors of the victim y, and $\text{noise}_{total}$ is the maximum noise at y when all aggressors contribute. Each subset of aggressors can be characterized by the amount of coupling noise it can inject using this simple linear model. Better coupling models might be applied here to take into account aggressor driver strength and slew rates.

As the number of strong aggressors is small, all possible subsets could be examined explicitly. All the subsets of aggressors are divided into bins provided by discretized noise values $\delta_j$. Let $\delta_{AS_i}$ denote the noise induced by a subset of aggressors $AS_i$. If there exists an input assignment under which all aggressors in $AS_i$ experience transitions that contribute to noise at the victim y then the noise $\delta_{AS_i}$ is feasible. Assume that $\delta_j$ is feasible if $$\delta_{AS_i} \in [\delta_{j-1}, \delta_j]$$

(this is a conservative estimation). The feasibility of $\delta_{AS_i}$ may be proved through checking the satisfiability of Boolean formula $$\pi_{A \in AS_i} A_{T_A}^\nu$$

where $\nu \in \{r, f\}$, depending on the direction of a required transition at an aggressor net, and $T_A$ is the time interval to be checked for aggressor A. Noise $\delta_j$ is feasible ($B_{\delta_j} = 1$) as long as there exists at least one subset of aggressors $AS_i$ such that $\delta_{AS_i}$ is feasible and is binned in $[\delta_{j-1}, \delta_j]$, i.e.

$$B_{\delta_j} = \sum_{\delta_{AS_i} \in [\delta_{j-1}, \delta_j]} \left( \prod_{A \in AS_i} A_{T_A}^\nu \right). \quad (8)$$

C. INPUT CONDITIONS

When required time intervals are propagated backward from the analyzed nets, multiple time intervals might be obtained at a PI/PPI, introducing many timed-Boolean variables (one for each interval). According to the single-transition assumption primary inputs switch at most once. Therefore the timed-Boolean variables for PI/PPIs satisfy persistence and monotonicity conditions. To satisfy persistence, variables at adjacent points in time of the same net have the same logic value unless there is a transition event between the two points. For monotonicity, there is at most one transition event.

These constraints may be enforced by examining all points of interest. Let a set Q for input x of a circuit contain all endpoints (sorted in time) of back-propagated intervals of four types ('0', '1', rise, and fall) together with two additional points $\{e_x, 1_x\}$ denoting the possible earliest and latest signal arrival time for x. Q induces a partition of the entire switching window of x. Introducing Boolean variables $x_{t_i}$ denoting the logic value of x at $t_i$, where $$t_i \in Q, 1 \le i \le k (k=|Q|),$$

gives the following relation for the persistency condition:

$$t_1 = e_x, t_k 1_x$$

$$x_{t_1} = x_{-\infty}, x_{t_k} = x_{+\infty}$$

$$x_{t_i} = \text{switch}_{i-1} \oplus x_{t_{i-1}}, 1 < i \le k \quad (9)$$

where $x_{-\infty}$ and $x_{+\infty}$ denote the initial (before $e_x$) and final (after $1_x$) settled logic values of x, respectively. The variable switch$_i$ denotes a Boolean variable that is equal to 1 if there is a transition at x between $t_i$ and $t_{i+1}$.

Monotonicity is enforced by the following constraints:

$$\overline{\text{switch}_i} + \overline{\text{switch}_j} = 1; \forall i \ne j. \quad (10)$$

Introducing a timed-Boolean variable $x_{T_i}^v$ ($v \in \{0, 1, r, f\}$) for each time partition $$T_i = [t_i, t_{i+1}]$$

induced by Q, the behavior of $x_{T_i}^v$ is described by the variables $x_{t_i}$ and $x_{t_{i+1}}$.

$$x_{T_i}^1 = x_{t_i} + x_{t_{i+1}}$$

$$x_{T_i}^0 = \overline{x_{t_i}} + \overline{x_{t_{i+1}}}$$

$$x_{T_i}^r = \overline{x_{t_i}} x_{t_{i+1}}$$

$$x_{T_i}^f = x_{t_i} \overline{x_{t_{i+1}}} \quad (11)$$

The behavior of a variable $x_T^v$ ($T = [t_m, t_n]$) coming from backward propagation is related to the input variables $x_{t_i}$ through the variables $x_{T_i}^v$, i.e., $$x_T^v = \sum_{i=m}^{n-1} x_{T_i}^v, (T = [t_m, t_n]). \quad (12)$$

Equations (9) through (12) introduce additional clauses into the satisfiability formulation and constrain every SAT solution to conform with the monotonicity assumption at the inputs to the circuit.

Pruning the Size of Satisfiability Formulation

The method may use two different techniques to help to keep the size of the satisfiability formulation manageable. The first technique, temporal pruning, exploits the arrival switching windows (obtained from the worst-case noise analysis) to prune the time intervals propagated backward. The second technique is a method of interval merging that keeps the size of the formula linear to the size of a circuit and makes the noise analysis method scalable. Although this technique may introduce over-approximation in the results of noise analysis, the loss of accuracy is generally within acceptable limits (i.e., it usually does not exceed 10% in the amount of pruned false noise faults).

A. Temporal Pruning

During backward time interval propagation, required times may be derived outside the bounds of the arrival times. In this case, a backward time interval is pruned by the arrival time window. Suppose on a net g, a required time interval is $$T = [t_1, t_2]$$

and the noisy arrival time window is $$sw^n(g) = [e_g^n, l_g^n]$$

(for a conservative consideration). Denote by $g_{-\infty}$ and $g_{+\infty}$ the initial (before $e_g^n$) and final (after $l_g^n$) settled logic values of the net g respectively. The two time points $e_g^n$ and $l_g^n$ may divide T into as many as 3 partitions, where $$T_i = [e_i, l_i],$$

and each partition is either disjoint with $sw^n(g)$ or fully contained in $sw^n(g)$. In the case of $$T \subseteq sw^n(g)$$

or $$T \cap sw^n(g) = \emptyset,$$

T plays as a single partition. From the definition of interval logic, $$g_T^v = \sum_i g_{T_i}^v, \left(T = \bigcup_i T_i\right)$$

where $v \in \{0, 1, r, f\}$. Table II lists the values of $g_{T_i}^v$ for different cases.

Figure 6:
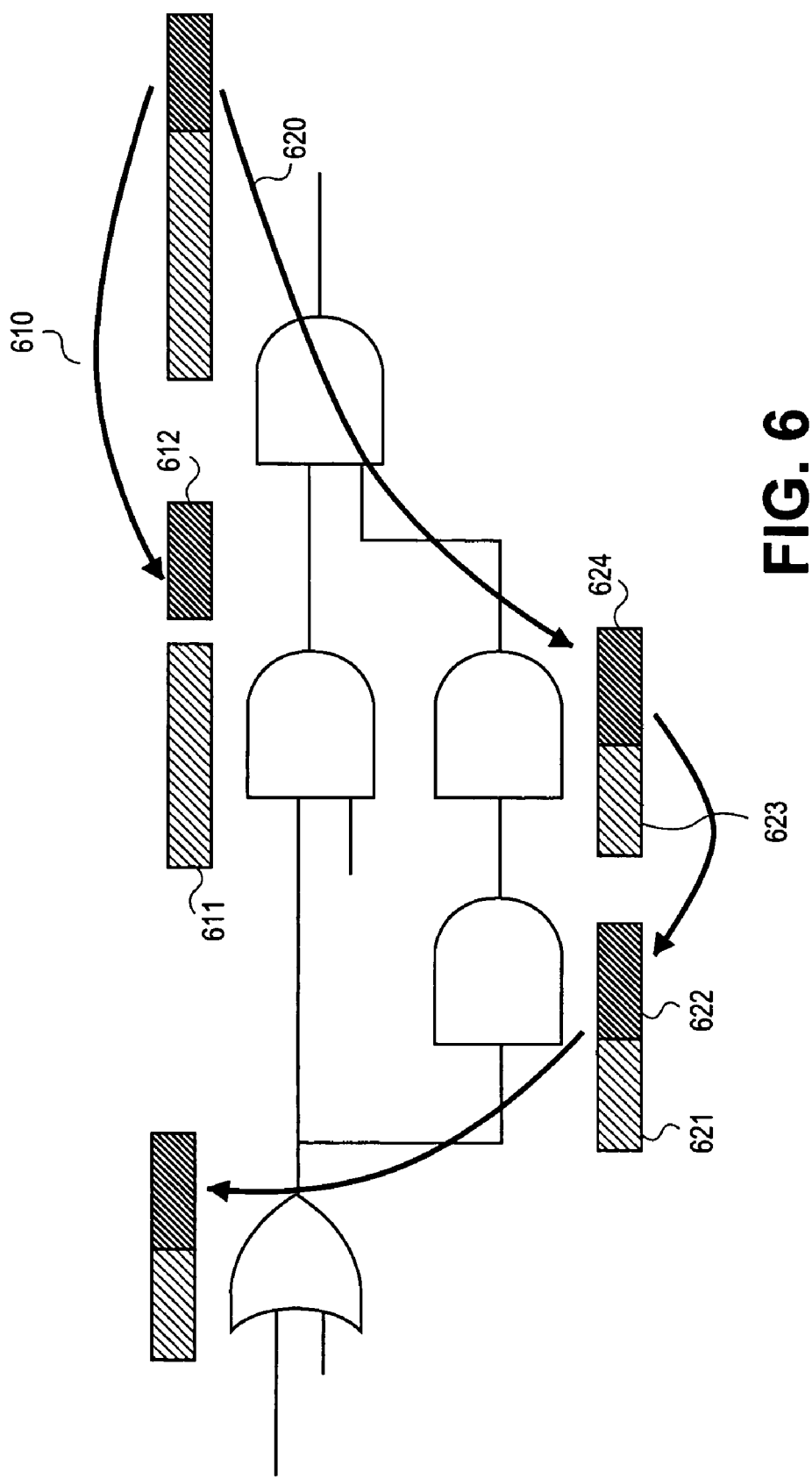
FIG. 6 shows an example of pruning to reduce the size of a satisfiability problem.

An example of pruning based on arrival time windows is shown in FIG. 6. The circuit has two paths, 610 and 620. The timing interval 612 propagated backward along the path 610 occurs outside of the switching window 611, and can therefore be removed from the noise analysis. The timing intervals 622 and 624 can overlap with respective switching windows 621 and 623, and are therefore considered during the noise analysis.

After the pruning, only the interval that occurs inside the arrival time window will be propagated backward. If the pruning generates an empty interval, the backward propagation stops for that branch. This technique helps to reduce the complexity of the problem by avoiding the introduction of unnecessary variables.

TABLE II

Temporal Pruning Boolean Relations
($T_i = [e_i, l_i], sw^n(g) = [e_g^n, l_g^n]$)

| | $l_i < e_g^n$ | $T_i \subseteq sw^n(g)$ | $e_i > l_g^n$ |
|---|---|---|---|
| $g_{T_i}^1$ | $g - \infty$ | $g_{T_i}^1$ | $g + \infty$ |
| $g_{T_i}^0$ | $\overline{g - \infty}$ | $g_{T_i}^0$ | $\overline{g + \infty}$ |
| $g_{T_i}^r$ | 0 | $g_{T_i}^r$ | 0 |
| $g_{T_i}^f$ | 0 | $g_{T_i}^f$ | 0 |

B. Interval Merging

Whenever there are re-convergent paths, there may be an exponential number of paths between two nets. When time intervals are propagated backward, this could lead to an exponential number of intervals (one path may introduce one interval), as well as related timed-Boolean variables. Even after temporal pruning, the number of sets of switching intervals and timed-Boolean variables may be large. To deal with this, the analysis can be approximated by selectively merging a pair of intervals $T_1$ and $T_2$ to create a new interval $$T_{new} = T_1 \cup T_2.$$

After merging, only an interval $T_{new}$ is propagated backward. When the SAT formula is then built, for variables related to $T_1$ and $T_2$, a conservative approximation is made, such that $$g_{T_1}{}^v = g_{T_2}{}^v = g_{T_{new}}{}^v \ (v \in \{0, 1, r, f\}),$$

i.e., the process assumes that both $g_{T_1}{}^v$ and $g_{T_2}{}^v$ are true once $g_{T_{new}}{}^v$ is true.

To control accuracy, the heuristic may wait until a threshold number of intervals per net is reached, and then merge the pair of intervals having a greatest amount of overlap or having a closest location to each other. Choosing different threshold values provides a trade-off between accuracy and computation time.

Figure 7A:
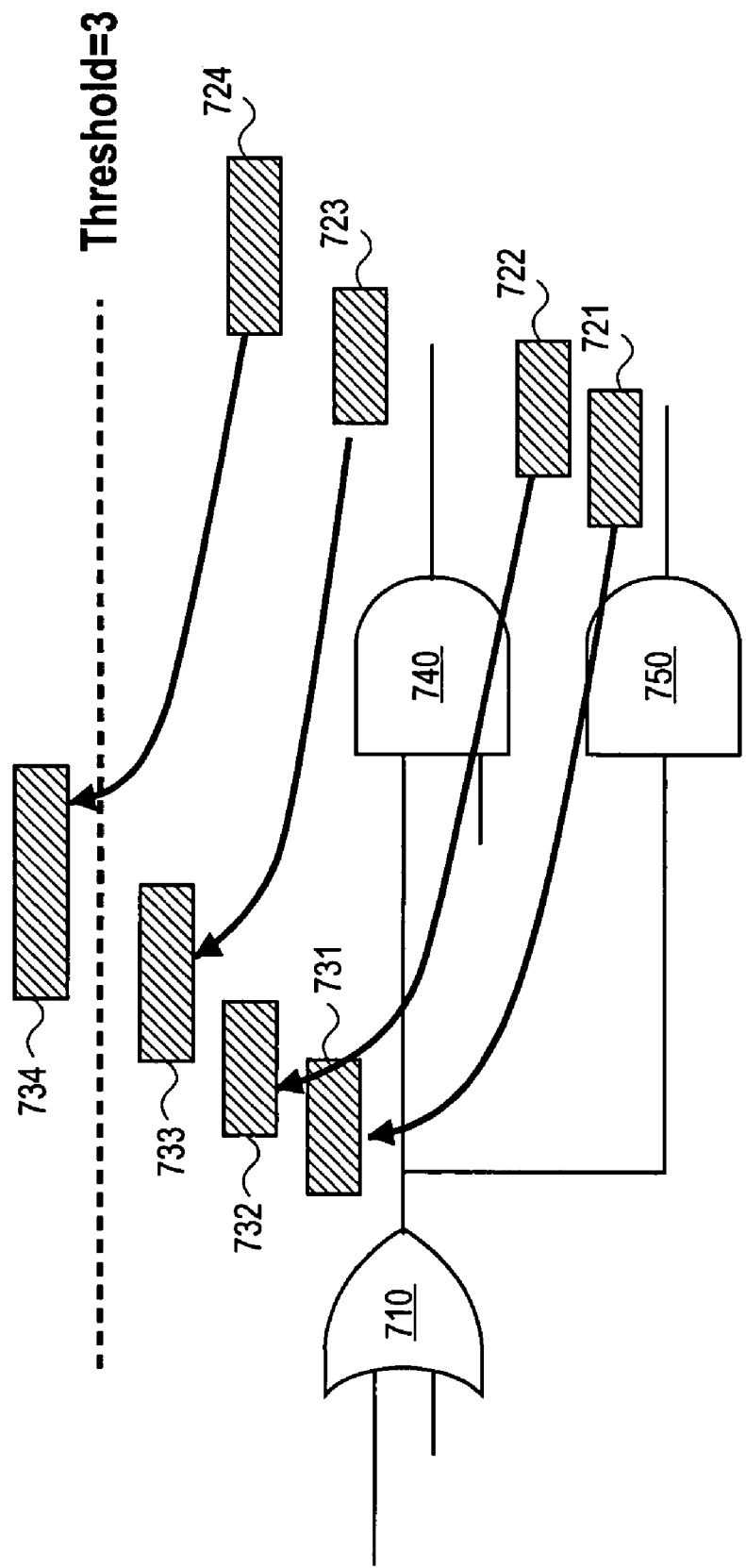
FIGS. 7(a) and 7(b) show an example of merging intervals to reduce the size of a satisfiability problem.
Figure 7B:
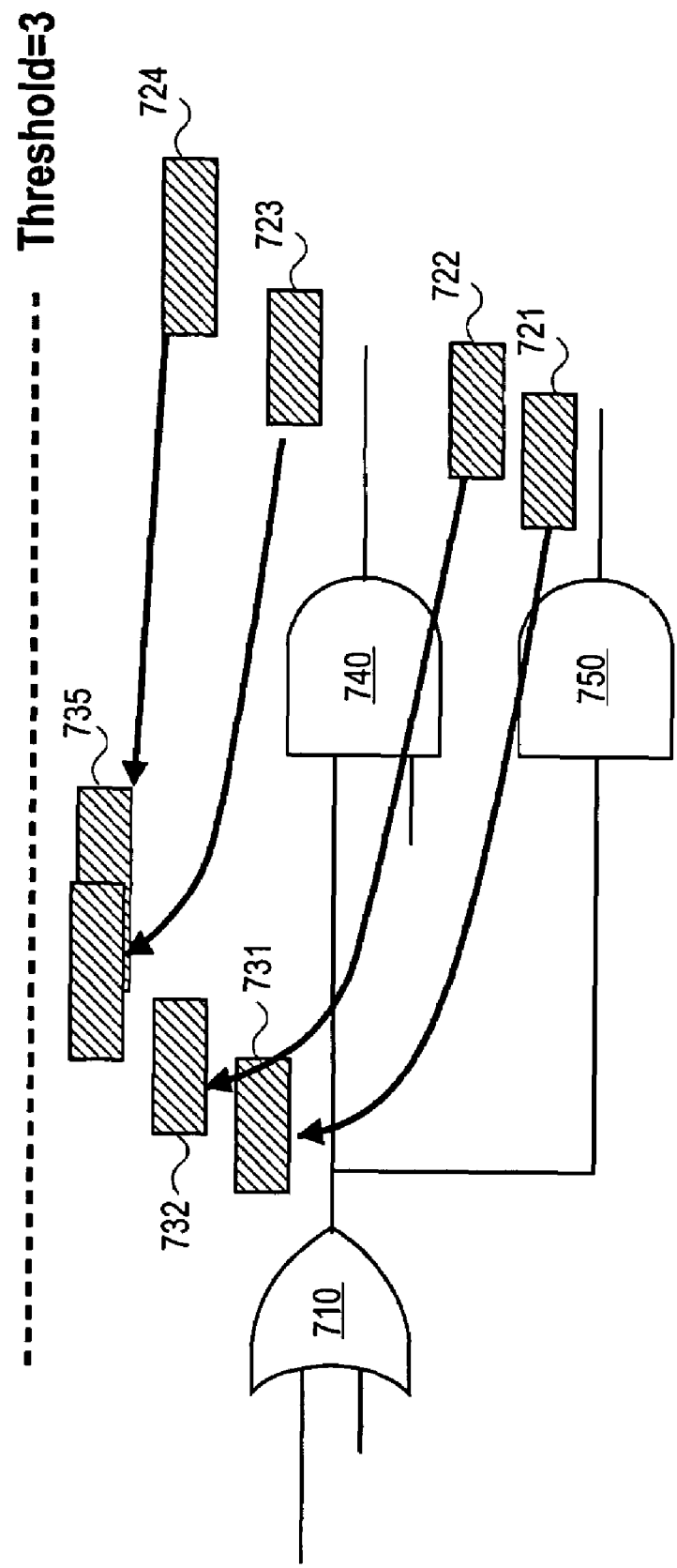

FIGS. 7(a) and 7(b) show an example of interval merging, with a threshold number of 3. As shown in FIG. 7(a), the intervals 721 and 722 are back propagated to the input of gate 750 to produce windows 731 and 732. The intervals 723 and 724 are back propagated to the input of gate 740 to generate windows 723 and 724. The two gates, 740 and 750, share a common input, which is the output of gate 710. This common input has four switching windows, 731, 732, 733, and 734, which exceeds the threshold amount by 1. Therefore, windows 733 and 734 shown in FIG. 7(a) are merged to form a single window 735, as shown in FIG. 7(b).

Delay Noise Analysis

With the above formulas, the method specifies the behavior of a combinational logic by a timed-Boolean formula to account for functional and temporal conditions for all noise delays. The conditions are feasible if there exists an input pattern that makes the formula satisfiable. This could be efficiently determined using a SAT-based technique. This method for performing a finer noise analysis after performing the worst-case noise analysis can be applied to a single net to estimate the amount of delay noise at the particular net. This method can also be applied to a path- or cone-based circuit design to consider a cumulative effect of crosstalk while propagating signals through the particular path or cone. In the path-based analysis, only the noise occurring on the nets along the path are explicitly examined for noise feasibility, and all the side inputs are assumed to have the worst-case noise propagation. In the cone-based analysis, all the noisy nets in the entire cone are subject to the explicit noise-feasibility check. Thus, the cone-based analysis simultaneously checks the feasible arrival time for all the paths ending at the endpoint of the cone.

A. Single Net Noise Analysis

In the single net noise analysis, an explicit check is performed only for a particular victim net g together with its set of aggressors. Net g is a subject of the refined noise analysis, while the rest of the formulation (for fan-ins of g and its aggressors) uses the worst-case noise propagation. The analysis takes as an input the following:

(a) a set of noisy switching windows $sw''(y) = [e_y'', l_y'']$ for every net y in the circuit from the worst-case noise analysis, (b) a set of gate delays specified in terms of pin-to-output delay intervals padded with maximal slowdown and speedup, (c) a victim g and a set of aggressors Aggr(g), (d) maximal slowdown $\delta^+(g)$ and speedup $\delta^-(g)$ due to noise when all the aggressors are considered active, and (e) a noise discretization step $\Delta$.

Both the maximal slowdown and the maximal speedup that are feasible are analyzed. For the slowdown analysis, the method iterates noise delay time from $\delta = \delta^+(g)$ to $\delta = 0$ while decrementing the noise delay by the discretization step $\Delta$ at each iteration, until the slowdown $\delta$ is identified as feasible. Similarly, for the speedup analysis, the method iterates from $\delta = \delta^-(g)$ to $\delta = 0$. In either case, following the required time propagation, timed-Boolean variables are defined for corresponding transitions in each time window given for each net, and a SAT formula is built by encoding their relationship across gates using the gate functionalities as described above.

Figure 8:
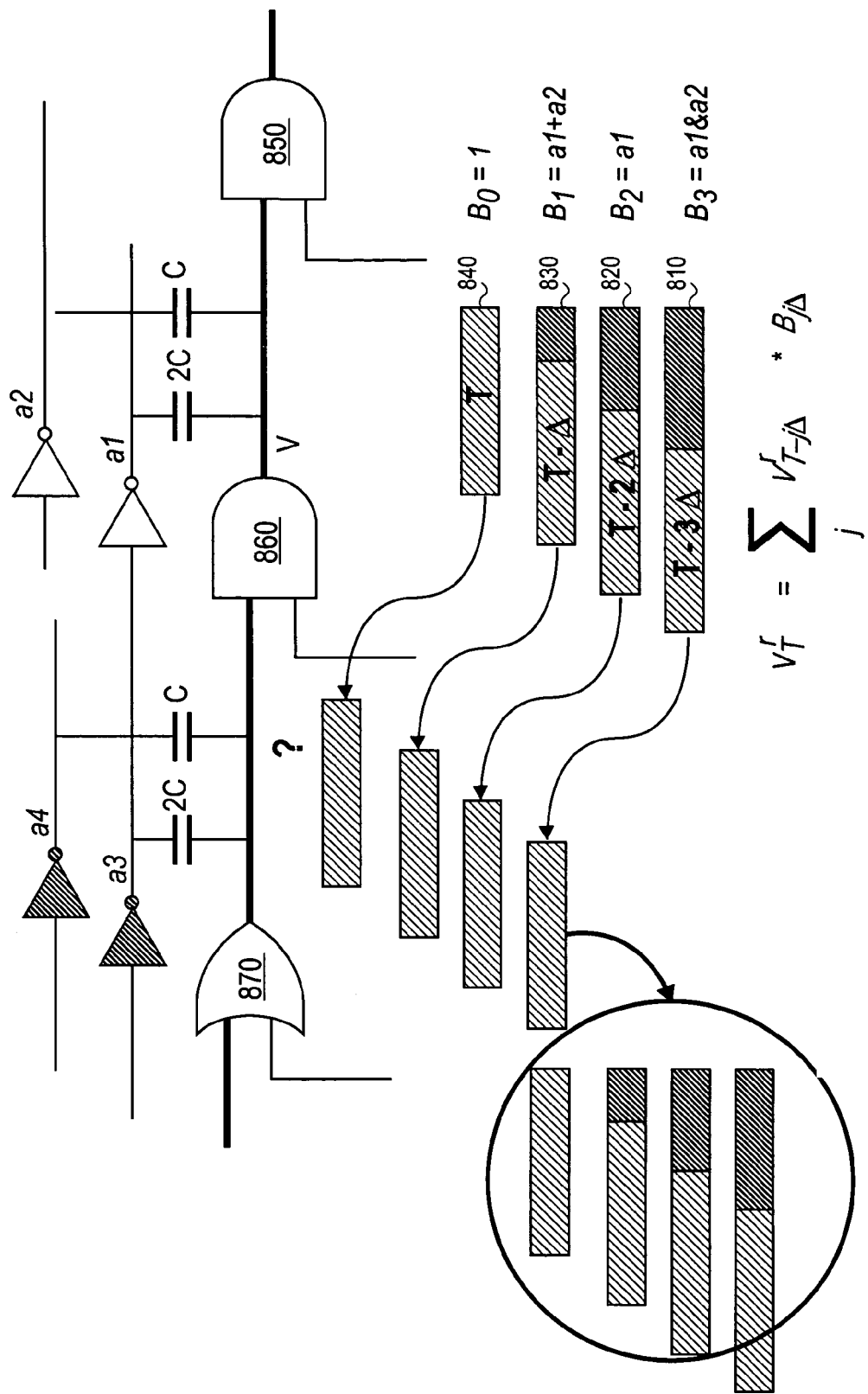
FIG. 8 shows an example of a net that is analyzed by a method for eliminating false positives in crosstalk noise analysis.

An example of a victim net v for gate 850 that is analyzed with aggressor nets a1, a2, is shown in FIG. 8. The discretization step $\Delta$ is the maximum delay, $\delta_{max}$, divided by 3. This produces four iterations of analysis, when the delay is maximum (3$\Delta$), 810, when the delay is decremented by $\Delta$ (to give a delay of 2$\Delta$), 820, when the delay is decremented by 2$\Delta$ (to give a delay of $\Delta$), 830, and when there is no delay (the delay is decremented by 3$\Delta$), 840. The maximum delay of 3$\Delta$ occurs when both aggressors a1 and a2 switch within a switching window. The delay of 2$\Delta$ occurs when aggressor a1 switches, the delay of $\Delta$ occurs when either a1 or a2 switches, and no delay occurs if neither aggressor switches during the switching window. Starting with the worst-case delay of 3$\Delta$, each delay is back propagated to the input of the net until a delay is identified as feasible. For example, the delay intervals 810, 820, 830 and 840 are propagated back to the input of gate 860. There, the delay intervals, along with the delays from aggressors a3 and a4, are back propagated to the input of gate 870, in order to find a delay that is feasible for the net.

B. Cone and Path Delays in the Presence of Noise

To consider correlations between noise delays in the fan-in of the net g, a cone and/or path-based analysis is performed. For a given cone (or path), a refined noise propagation is performed in a backward topological order such that feasibility conditions for noise delays in all traversed stages are accumulated in a single formula. In this way, the correlations between noise delays of different stages are properly managed.

In addition to the input data used in the single net noise analysis, the following information is used:

(a) path (or cone) of logic $L = \{g_1, \ldots, g_i, \ldots, g_k\}$, (b) the set of strong aggressors Aggr($g_i$) for each net $g_i$ in L, (c) worst-case slowdown $\delta^+(g_i)$ (or speedup $\delta^-(g_i)$) of net $g_i$ in L, and (d) a step $\Delta$ to discretize slowdown or speedup noise.

Given the terminal net $g_k$ of L with a noise-free latest arrival time $l_{g_k}$ from a nominal switching window and a noisy latest arrival time $l_{g_k}''$ from a noisy switching window (with worst-case slowdown), the feasible signal arrival time in $T = [l_{g_k}, l_{g_k}'']$ is determined by checking how much noise accumulation is feasible. This is done by recursively constructing the SAT formula using expression (6) over variables $g_{k,T}{}^v$, where $v \in \{r, f\}$ depends on the signal transition direction of $g_k$. In constructing the SAT formula backward from $g_k$, refined noise propagation is applied to nets in L, while for side inputs, the worst-case noise propagation is applied. A binary search may be used on T to search the latest feasible signal arrival time at $g_k$ taking into account correlations in the fan-in cone.

Figure 9:
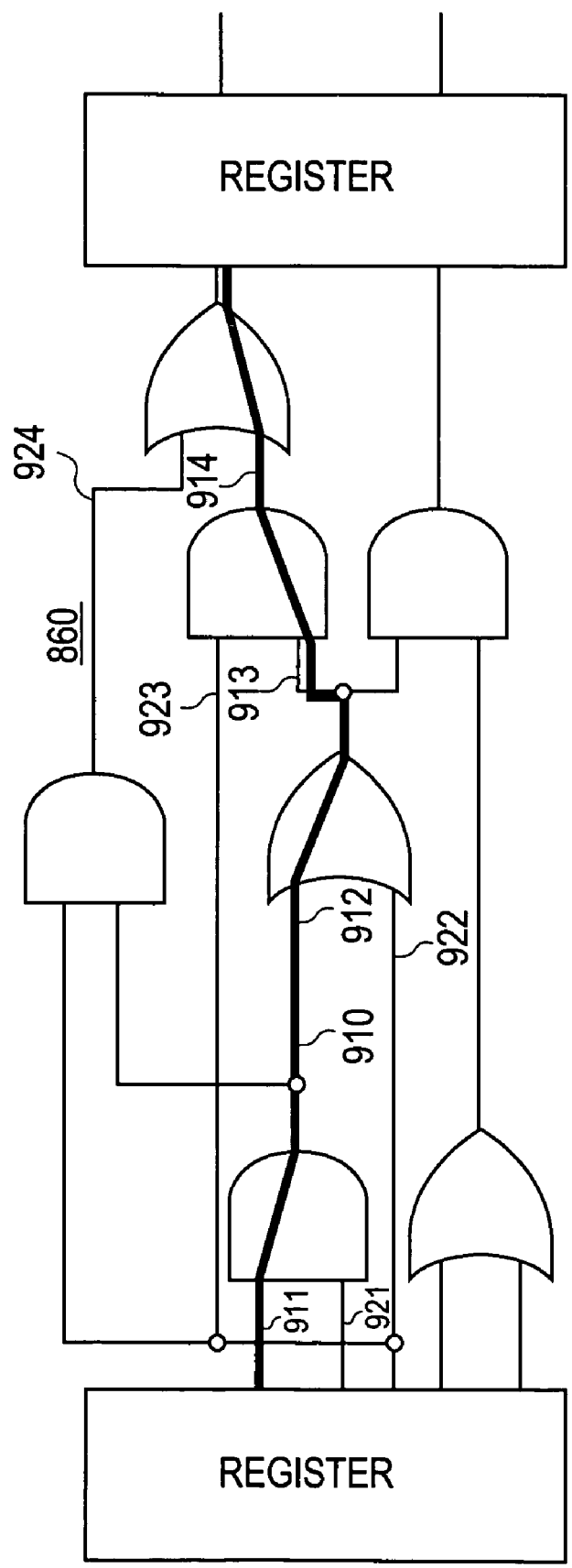
FIG. 9 shows an example of a path that is analyzed by a method for eliminating false positives in crosstalk noise analysis.

An example of a path that is analyzed based on interval delay models is shown in FIG. 9. The delays to inputs 911, 912, 913, and 914 along path 910 are analyzed based on a refined noise analysis to iterate the delay by $\Delta$, until a feasible delay is determined. The delays for side inputs 921, 922, 923 and 924 are analyzed based on a worst-case delay model, using $\delta_{max}$.

Figure 10:
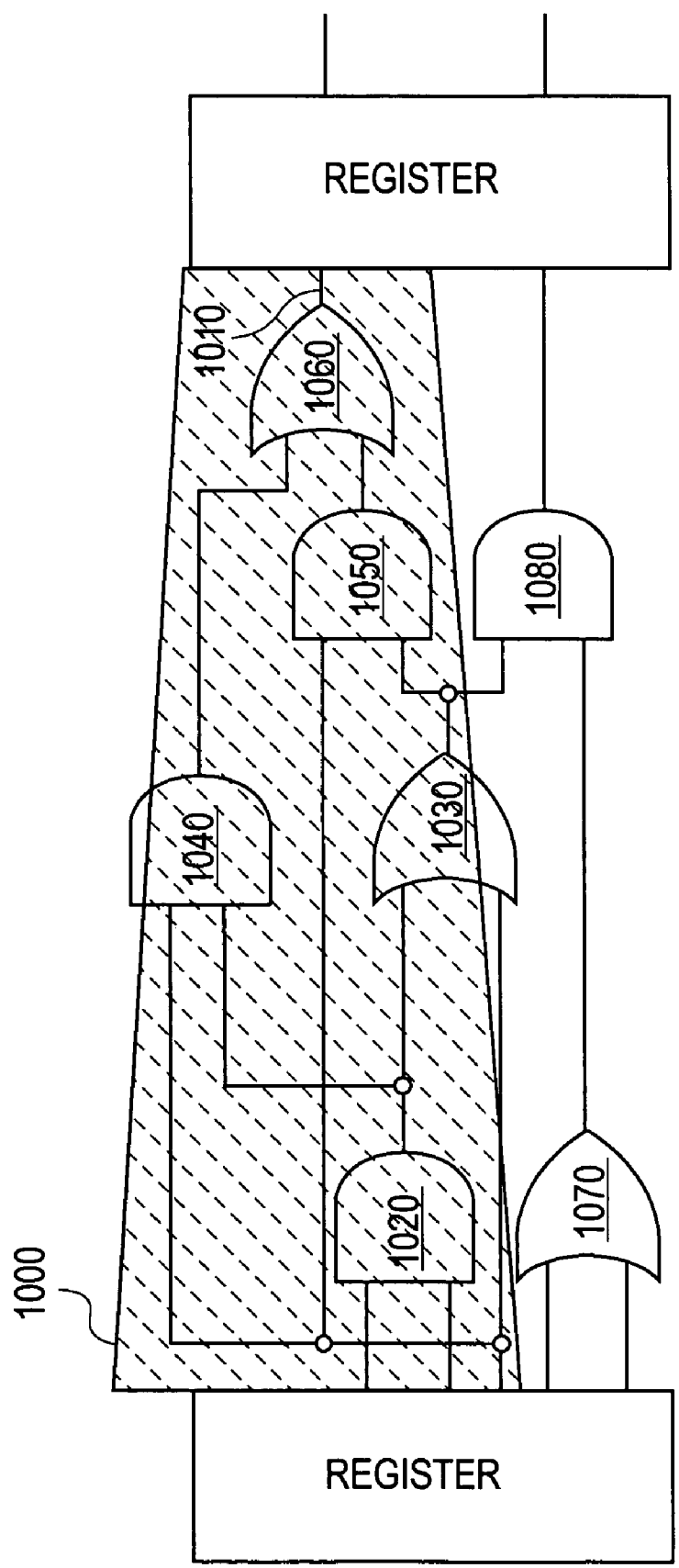
FIG. 10 shows an example of a cone that is analyzed by a method for eliminating false positives in crosstalk noise analysis.

In practice, an objective of noise analysis is to find the delay faults that produce timing violations. These violations (such as hold or setup) are revealed through the cone-based noise analysis for endpoints (PO/PPOs), as shown in FIG. 10, for example. In the cone-based analysis, all the noisy nets in the entire cone are subject to the explicit noise-feasibility check. Thus, the cone-based analysis simultaneously checks the feasible arrival time for all the paths ending at the endpoint of the cone.

The endpoint, 1010, of cone 1000, and inputs to stages 1020, 1030, 1040, 1050, and 1060 of cone 1000, are analyzed based on a refined noise analysis, as shown in FIG. 8 for example. The inputs to stages 1070 and 1080, which are outside of cone 1000, are analyzed based on a worst-case delay model. If a change of delay due to noise at an endpoint does not produce timing violations, the endpoint may be safely removed from noise analysis. One can perform an exhaustive testing of the endpoints for which the worst-case analysis shows timing violations. These endpoints are checked for a maximal feasible slowdown/speedup, and the refined noise values are reported.

C. Complexity Issues

Although in theory SAT solving is NP-complete, the complexity of solving it for practical cases strongly correlates with the size of SAT formula. In one approach, the size of the formula is proportional to the number of time intervals obtained during backward propagation. Let TFI(N) be the set of nets in the transitive fan-in cone of nets N, and let the threshold value for interval merging be m. The size of SAT formula checked during the analysis is then, for a single net g analysis:

$$|SAT|=O(m \times |TFI(\{v\} \cup Aggr(v))|),$$

or, for a path or cone, analysis, where the path or cone is $L=\{g_1, \ldots, g_k\}$:

$$|SAT|=O(m \times |TFI(\{g_k\} \cup Aggr(L))|).$$

The overall complexity of the SAT formula is linear to the size of the combinational cloud in the transitive fan-in of interest, because the number of time-Boolean variables for each net is kept below the pre-defined threshold.

Extension to Functional Noise Analysis

A functional noise failure occurs in a circuit only when the glitch noise is propagated to the inputs of latches and is incorrectly latched. In other words, a glitch noise has to occur in a specified time interval, called the observability window, with required amplitude and width for functional noise faults to happen. The procedure of delay noise checking can be directly applied to functional noise analysis as well.

Given the observability window of the victim net, one needs to check whether the noise with required amplitude is feasible within the window. This can be done by constructing SAT formula similar to that used in delay noise case with the exception of the victim being quiet in the observability window.

Test Pattern Generation

If the SAT formula is satisfied, the SAT-based approach has an additional advantage in providing a feasible worst-case noise scenario (in terms of transitions at primary inputs and internal nets of a circuit). In other words, the SAT solver provides a set of input patterns for which the considered fault is regarded as feasible. This set of input patterns can be used for testing. However, this proposed SAT analysis is conservative, and therefore, there is no guarantee that the reported input patterns would indeed sensitize the fault.

The main sources of over-approximation in the SAT formulation are the nature of interval modeling, inaccuracy in backward propagation, and interval merging. For the nature of interval modeling, the behavior of a signal within an interval is represented by four Boolean variables, and different behavior patterns may get exactly the same values of Boolean variables. While propagating backward, the intervals tend to grow because their latest arrival times are propagated by the minimal pin-to-output delay while earliest arrival times by the maximal pin-to-output delay. In addition, in the worst-case noise propagation, correlations between noise sources are not taken into account. For interval merging, when two intervals are merged into a new one, then any of them being satisfiable makes a new one satisfiable as well. Because of this, it is no longer possible to distinguish cases when one of the two intervals is satisfiable while the other is not.

However, these sources of over-approximation can keep the size of the problem tractable. Therefore, instead of improving the accuracy of the analysis by sacrificing the computational efficiency of interval modeling, backward propagation, and interval merging, a procedure may be performed to check whether the reported input patterns are suitable for the fault sensitization through simulation of their forward propagation through a circuit. The pattern simulation uses the same interval modeling as in the satisfiability check. Forward propagation of transitions and steady values '1' or '0' from inputs to the output of a gate is performed by reversing the formulas for backward propagation given above.

In order to avoid unnecessary computation, the simulation propagates transitions only through the combinational logic that is relevant for checking the considered nets. As with backward propagation, the simulation technique might result in a blow up in the number of intervals when re-convergent paths are considered. Applying interval merging would result in the conservative approximation which might be inconsistent with the one applied during SAT. Therefore, to maintain consistency of approximation between SAT solving and justification procedure, the process of temporal pruning and interval merging in forward propagation is guided using the set of time intervals obtained in SAT formula construction. More formally, let $$\mathbf{T}_B=\{T_B^1, \ldots, T_B^k\} \text{ and } \mathbf{T}_F=\{T_F^1, \ldots, T_F^l\}$$

be the sets of backward and forward-propagated time intervals for net y on a specific value $$v (v \in \{1,0,r,f\}).$$

Then, pruning the sets of the forward-propagated intervals is done according to the following rules:

Temporal pruning: Each of the forward propagation intervals $T_F^i$ is pruned by discarding the sub-intervals that do not overlap with $T_B$. Note that this does not introduce any inaccuracy in the forward propagation because the discarded sub-intervals do not contribute to justification of a fault reported by SAT.

Consistency in interval merging: Two forward intervals $T_F^i$ and $T_F^j$ are merged if and only if they are covered by the same backward interval $T_B^m$.

Using these two techniques guarantees that the number of forward propagated intervals is kept below the predefined threshold, and that they are approximated consistently with backward propagation. Fault justification through a forward propagation of input patterns may have two possible outcomes. First, the SAT imposes a rising (falling) transition at net g (or path/cone endpoint) at time interval $T_B^i$ and simulation confirms its feasibility at a time interval $T_F^j \subseteq T_B^i$. In this case the input pattern is successfully justified and is suitable for using in testing. Second, the SAT imposes a rising (falling) transition at net g (or path/cone endpoint) at time interval $T_B^i$ while simulation fails to confirm a feasible transition within this interval. This reveals the over-approximation of SAT formulation and the obtained input pattern is useless for testing.

System Architecture Overview

Figure 11:
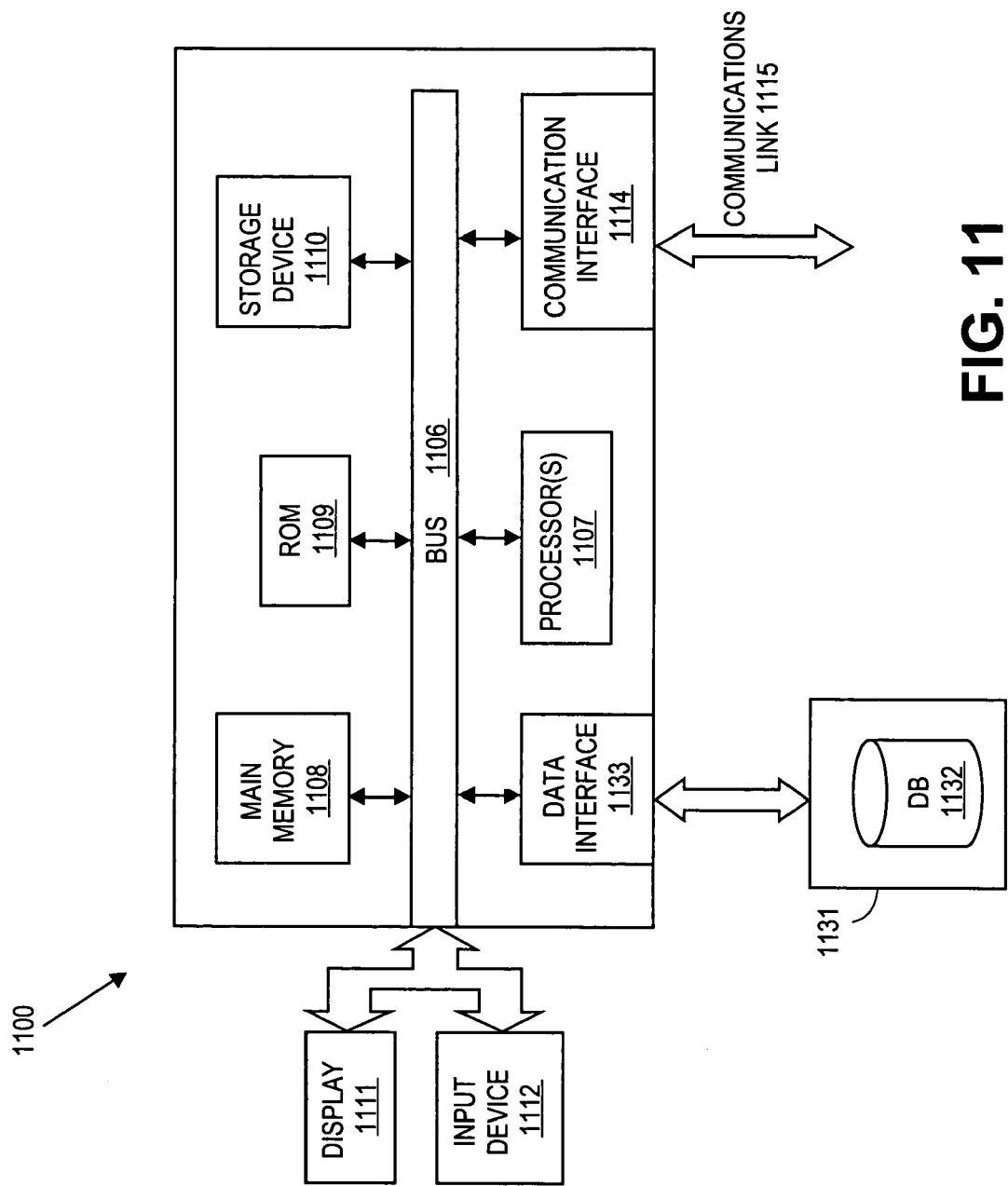
FIG. 11 shows an example of a computer processing system that can store and execute a computer program to perform the method for eliminating false positives in crosstalk noise analysis.

The execution of the sequences of instructions required to practice the invention may be performed in embodiments of the invention by a computer system 1100 as shown in FIG. 11. In an embodiment of the invention, execution of the sequences of instructions required to practice the invention is performed by a single computer system 1100. According to other embodiments of the invention, two or more computer systems 1100 coupled by a communication link 1115 may perform the sequence of instructions required to practice the invention in coordination with one another. In order to avoid needlessly obscuring the invention, a description of only one computer system 1100 will be presented below; however, it should be understood that any number of computer systems 1100 may be employed to practice the invention.

A computer system 1100 according to an embodiment of the invention will now be described with reference to FIG. 11, which is a block diagram of the functional components of a computer system 1100 according to an embodiment of the invention. As used herein, the term computer system 1100 is broadly used to describe any computing device that can store and independently run one or more programs.

Each computer system 1100 may include a communication interface 1114 coupled to the bus 1106. The communication interface 1114 provides two-way communication between computer systems 1100. The communication interface 1114 of a respective computer system 1100 transmits and receives electrical, electromagnetic or optical signals, that include data streams representing various types of signal information, e.g., instructions, messages and data. A communication link 1115 links one computer system 1100 with another computer system 1100. For example, the communication link 1115 may be a link to the internet through a telephone line, cable line, optical fiber, or an electromagnetic wave. The communication link may also be a LAN, in which case the communication interface 1114 may be a LAN card, or the communication link 1115 may be a PSTN, in which case the communication interface 1114 may be an integrated services digital network (ISDN) card or a modem.

A computer system 1100 may transmit and receive messages, data, and instructions, including program, i.e., application, code, through its respective communication link 1115 and communication interface 1114. Received program code may be executed by the respective processor(s) 1107 as it is received, and/or stored in the storage device 1110, or other associated non-volatile media, for later execution.

In an embodiment, the computer system 1100 operates in conjunction with a data storage system 1131, e.g., a data storage system 1131 that contains a database 1132 that is readily accessible by the computer system 1100. The computer system 1100 communicates with the data storage system 1131 through a data interface 1133. A data interface 1133, which is coupled to the bus 1106, transmits and receives electrical, electromagnetic or optical signals, that include data streams representing various types of signal information, e.g., instructions, messages and data. In embodiments of the invention, the functions of the data interface 1133 may be performed by the communication interface 1114.

Computer system 1100 includes a bus 1106 or other communication mechanism for communicating instructions, messages and data, collectively, information, and one or more processors 1107 coupled with the bus 1106 for processing information. Computer system 1100 also includes a main memory 1108, such as a random access memory (RAM) or other dynamic storage device, coupled to the bus 1106 for storing dynamic data and instructions to be executed by the processor(s) 1107. The main memory 1108 also may be used for storing temporary data, i.e., variables, or other intermediate information during execution of instructions by the processor(s) 1107.

The computer system 1100 may further include a read only memory (ROM) 1109 or other static storage device coupled to the bus 1106 for storing static data and instructions for the processor(s) 1107. A storage device 1110, such as a magnetic disk or optical disk, may also be provided and coupled to the bus 1106 for storing data and instructions for the processor(s) 1107.

A computer system 1100 may be coupled via the bus 1106 to a display device 1111, such as, but not limited to, a cathode ray tube (CRT), for displaying information to a user. An input device 1112, e.g., alphanumeric and other keys, is coupled to the bus 1106 for communicating information and command selections to the processor(s) 1107.

According to one embodiment of the invention, an individual computer system 1100 performs specific operations by their respective processor(s) 1107 executing one or more sequences of one or more instructions contained in the main memory 1108. Such instructions may be read into the main memory 1108 from another computer-usable medium, such as the ROM 1109 or the storage device 1110. Execution of the sequences of instructions contained in the main memory 1108 causes the processor(s) 1107 to perform the processes described herein. In alternative embodiments, hard-wired circuitry may be used in place of or in combination with software instructions to implement the invention. Thus, embodiments of the invention are not limited to any specific combination of hardware circuitry and/or software.

The term "computer-usable medium," as used herein, refers to any medium that provides information or is usable by the processor(s) 1107. Such a medium may take many forms, including, but not limited to, non-volatile, volatile and transmission media. Non-volatile media, i.e., media that can retain information in the absence of power, includes the ROM 1109, CD ROM, magnetic tape, and magnetic discs. Volatile media, i.e., media that can not retain information in the absence of power, includes the main memory 1108. Transmission media includes coaxial cables, copper wire and fiber optics, including the wires that comprise the bus 1106. Transmission media can also take the form of carrier waves; i.e., electromagnetic waves that can be modulated, as in frequency, amplitude or phase, to transmit information signals. Additionally, transmission media can take the form of acoustic or light waves, such as those generated during radio wave and infrared data communications.

A method of eliminating false positives in crosstalk noise analysis of a circuit design has been described. In one embodiment, the method identifies a possible noise fault for one or more timing intervals based on a timing analysis of a victim net and at least one aggressor net of the circuit design, and determines whether the noise fault for each identified timing interval is feasible based on a behavioral representation of the victim net and the at least one aggressor net for the timing interval. The method may determine whether the noise fault is feasible by generating a behavioral correlation between the victim net and the at least one aggressor net for the timing interval, which may be generated by determining a transition for an output node of the victim net for the timing interval, and determining a number of transitions for each input node of the victim net for the timing interval based on the transition for the output node. The number of transitions for each input node may be determined by back propagating the transition of the output node of the victim net for the timing interval to each input node of the victim net. The number of transitions for each input node may be determined by dividing the timing interval into a plurality of sub-intervals, and back propagating the transition of the output node for one or more sub-intervals to one or more input nodes of the victim net.

The method may determine whether the noise fault for each identified timing interval is feasible by determining whether at least one input node has more than one transition. The method may determine whether the noise fault for each identified timing interval is feasible by constructing a satisfiability formula based on the behavioral representation for the timing interval, and determining whether the satisfiability formula for the timing interval is satisfiable. The satisfiability formula may be generated by representing behavior of circuit nets for the timing interval using one or more multi-valued Boolean variables. The satisfiability formula may be pruned before determining whether the satisfiability formula is satisfiable.

If the noise fault is unfeasible, the method may remove the noise fault from the analysis. If the noise fault is feasible, the method may generate a set of input test patterns based on the represented behavior of circuit nets. The generated set of input test patterns may be propagated forward through the circuit nets. The set of input test patterns may be pruned before propagating the set of input test patterns.

In the foregoing specification, the invention has been described with reference to specific embodiments thereof. It will, however, be evident that various modifications and changes may be made thereto without departing from the broader spirit and scope of the invention. For example, the reader is to understand that the specific ordering and combination of process actions shown in the process flow diagrams described herein is merely illustrative, and the invention can be performed using different or additional process actions, or a different combination or ordering of process actions. The specification and drawings are, accordingly, to be regarded in an illustrative rather than restrictive sense.

What is claimed is:

1. A method for analyzing a circuit design, the method comprising:
    identifying a possible noise fault for one or more timing intervals based on a timing analysis of a victim net and at least one aggressor net of the circuit design; and
    determining whether the possible noise fault for each identified timing interval is feasible based in part on a unified Boolean and timing representation of the victim net and the at least one aggressor net for the each identified timing interval, in which the unified Boolean and timing representation uses an interval delay model for an intrinsic delay (pin-to-output delay) of a circuit component.

2. The method of claim 1, in which the act of determining whether the possible noise fault for each identified timing interval is feasible based in part on a unified Boolean and timing representation comprises:
    generating a behavioral correlation between the victim net and the at least one aggressor net for the each identified timing interval.

3. The method of claim 2, in which the act of generating a behavioral correlation comprises:
    determining a transition for an output node of the victim net for the each identified timing interval; and
    determining a number of transitions for each input node of the victim net for the each identified timing interval based on the transition for the output node.

4. The method of claim 3, in which the act of determining a number of transitions for each input node comprises:
    back propagating the transition of the output node of the victim net for the each identified timing interval to each input node of the victim net.

5. The method of claim 3, in which the act of determining a number of transitions for each input node comprises:
    dividing the each identified timing interval into a plurality of sub-intervals; and
    back propagating the transition of the output node for one or more sub-intervals to one or more input nodes of the victim net.

6. The method of claim 3, in which the act of determining whether the possible noise fault for each identified timing interval is feasible comprises:
    determining whether at least one input node has more than one transition.

7. The method of claim 1, in which the act of determining whether the possible noise fault for each identified timing interval is feasible further comprises:
    constructing a satisfiability formula based on the behavioral representation for the each identified timing interval; and
    determining whether the satisfiability formula for the each identified timing interval is satisfiable.

8. The method of claim 7, in which the act of constructing a satisfiability formula comprises:
    representing behavior of circuit nets for the each identified timing interval using one or more multivalued Boolean variables.

9. The method of claim 8, further comprising:
    determining that the possible noise fault is feasible; and
    generating a set of input test patterns based on the represented behavior of circuit nets.

10. The method of claim 9, further comprising:
propagating the set of input test patterns forward through the circuit nets.

11. The method of claim 10, further comprising:
pruning the set of input test patterns before propagating the set of input test patterns.

12. The method of claim 7, further comprising:
pruning the satisfiability formula before determining whether the satisfiability formula is a satisfiable.

13. The method of claim 1, further comprising:
determining that the possible noise fault is unfeasible; and
removing the unfeasible noise fault from analyzing the circuit design.

14. The method of claim 1, in which one or more weak aggressors are modeled by a single virtual aggressor which is computed using weighted lumped approximation.

15. An apparatus for analyzing a circuit design, the apparatus comprising:
means for identifying a possible noise fault for one or more timing intervals based on a timing analysis of a victim net and at least one aggressor net of the circuit design; and
means for determining whether the possible noise fault for each identified timing interval is feasible based in part on a unified Boolean and timing representation of the victim net and the at least one aggressor net for the each identified timing interval, in which the unified Boolean and timing representation uses an interval delay model for an intrinsic delay (pin-to-output delay) of a circuit component.

16. The apparatus of claim 15, in which said means for determining whether the possible noise fault for each identified timing interval is feasible based in part on a unified Boolean and timing representation comprises:
means for generating a behavioral correlation between the victim net and the at least one aggressor net for the each identified timing interval.

17. The apparatus of claim 16 in which said means for generating a behavioral correlation comprises:
means for determining a transition for an output node of the victim net for the each identified timing interval; and
means for determining a number of transitions for each input node of the victim net for the each identified timing interval based on the transition for the output node.

18. The apparatus of claim 17, in which said means for determining a number of transitions for each input node comprises:
means for back-propagating the transition of the output node of the victim net for the each identified timing interval to each input node of the victim net.

19. The apparatus of claim 17, in which said means for determining a number of transitions for each input node comprises:
means for dividing the each identified timing interval into a plurality of sub-intervals; and
means for back-propagating the transition of the output node for one or more subintervals to one or more input nodes of the victim net.

20. The apparatus of claim 17, in which said means for determining whether the possible noise fault for each identified timing interval is feasible comprises:
means for determining whether at least one input node has more than one transition.

21. The apparatus of claim 15, in which said means for determining whether the possible noise fault for each identified timing interval is feasible further comprises:
means for constructing a satisfiability formula based on the behavioral representation for the each identified timing interval; and
means for determining whether the satisfiability formula for the each identified timing interval is satisfiable.

22. The apparatus of claim 21, in which said means for constructing a satisfiability formula comprises:
means for representing behavior of the circuit nets for the each identified timing interval using one or more multi-valued Boolean variables.

23. The apparatus of claim 22, further comprising:
means for determining that the possible noise fault is feasible; and
means for generating a set of input test patterns based on the represented behavior of circuit nets.

24. The apparatus of claim 23, further comprising:
means for propagating the set of input test patterns forward through the circuit nets.

25. The apparatus of claim 24, further comprising:
means for pruning the set of input test patterns before propagating the set of input test patterns.

26. The apparatus of claim 21, further comprising:
means for pruning the satisfiability formula before determining whether the satisfiability formula is satisfiable.

27. The apparatus of claim 15, further comprising:
means for determining that the possible noise fault is unfeasible; and
means for removing the unfeasible noise fault from analyzing the circuit design.

28. A computer readable medium storing a computer program of instructions which, when executed by a processing system, cause the processing system to perform a method for analyzing a circuit design, the method comprising:
identifying a possible noise fault for one or more timing intervals based on a timing analysis of a victim net and at least one aggressor net of the circuit design; and
determining whether the possible noise fault for each identified timing interval is feasible based in part on a unified Boolean and timing representation of the victim net and the at least one aggressor net for the each identified timing interval, in which the unified Boolean and timing representation uses an interval delay model for an intrinsic delay (pin-to-output delay) of a circuit component.

29. The computer readable medium of claim 28, in which the determining whether the possible noise fault for each identified timing interval is feasible based in part on a unified Boolean and timing representation comprises:
generating a behavioral correlation between the victim net and the at least one aggressor net for the each identified timing interval.

30. The computer readable medium of claim 29 in which the generating a behavioral correlation comprises:
determining a transition for an output node of the victim net for the each identified timing interval; and
determining a number of transitions for each input node of the victim net for each identified the timing interval based on the transition for the output node.

31. The computer readable medium of claim 30, in which the determining a number of transitions for each input node comprises:
   back propagating the transition of the output node of the victim net for the each identified timing interval to each input node of the victim net.

32. The computer readable medium of claim 30, in which the determining a number of transitions for each input node comprises:
   dividing the each identified timing interval into a plurality of sub-intervals; and
   back propagating the transition of the output node for one or more sub-intervals to one or more input nodes of the victim net.

33. The computer readable medium of claim 30, in which the determining whether the possible noise fault for each identified timing interval is feasible comprises:
   determining whether at least one input node has more than one transition.

34. The computer readable medium of claim 28, in which the determining whether the possible noise fault for each identified timing interval is feasible further comprises:
   constructing a satisfiability formula based on the behavioral representation for the each identified timing interval; and
   determining whether the satisfiability formula for the each identified timing interval is satisfiable.

35. The computer readable medium of claim 34, in which the constructing a satisfiability formula comprises:
   representing behavior of circuit nets for the each identified timing interval using one or more multivalued Boolean variables.

36. The computer readable medium of claim 35, in which the method further comprises:
   determining that the possible noise fault is feasible; and
   generating a set of input test patterns based on the represented behavior of circuit nets.

37. The computer readable medium of claim 36, in which the method further comprises:
   propagating the set of input test patterns forward through the circuit nets.

38. The computer readable medium of claim 37, in which the method further comprises:
   pruning the set of input test patterns before propagating the set of input test patterns.

39. The computer readable medium of claim 34, in which the method further comprises:
   pruning the satisfiability formula before determining whether the satisfiability formula is satisfiable.

40. The computer readable medium of claim 28, in which the method further comprises:
   determining that the possible noise fault is unfeasible; and
   removing the unfeasible noise fault from analyzing the circuit design.

41. A computer implemented method for eliminating false positives in crosstalk noise analysis of a circuit design, comprising:
   identifying a possible noise fault for one or more timing intervals based on a timing analysis of a victim net and at least one aggressor net of the circuit design;
   determining a unified Boolean and timing representation of the victim net and the at least one aggressor net for each identified timing interval;
   defining a satisfiability formula with the unified Boolean and timing representation, in which if the possible noise fault is feasible for a timing interval within the one or more timing intervals the satisfiability formula is deemed satisfiable;
   determining whether the satisfiability formula is satisfiable for the each identified timing interval; and
   storing a result of the determining whether the satisfiability formula is satisfiable in a tangible medium.

42. The computer implemented method of claim 41, in which the act of determining whether the satisfiability formula is satisfiable comprises:
   determining whether an internal node will switch during the one or more timing intervals by propagating a signal transition information in a unified Boolean and timing representation backward from a primary output through the internal node to a backward propagation termination point.

43. The computer implemented method of claim 42, in which the signal transition information comprises a timing information and a functionality information.

44. The computer implemented method of claim 41, in which the unified Boolean and timing representation is constructed by considering a noise delay.

45. The computer implemented method of claim 44, in which the act of considering a noise delay comprises incorporating an amount of noise into consideration.

46. The computer implemented method of claim 45, in which the act of considering a noise delay further comprises incorporating worst-case noise propagation.

47. The computer implemented method of claim 46, in which the worst-case noise propagation comprises incorporating a worst-case noise value into a pin-to-output delay.

48. The computer implemented method of claim 46, further comprising:
   identifying a critical part of the circuit design;
   constructing the unified Boolean and timing representation by considering the amount of noise in the critical part of the circuit design; and
   constructing the unified Boolean and timing representation by considering the worst-case noise propagation in another part of the circuit design.

49. The computer implemented method of claim 41, in which an act of propagating a signal transition information backward is performed at the victim net and the at least one aggressor net.

50. The computer implemented method of claim 41, further comprising:
   identifying a primary output, a backward propagation termination point, and an internal node between the backward propagation termination point and the primary output; and
   analyzing a switching activity at the internal node.

51. The computer implemented method of claim 50, in which the backward propagation termination point comprises a primary input or a register output.

52. The computer implemented method of claim 41, in which the act of determining whether the satisfiability formula is satisfiable for each identified timing interval comprises:
   analyzing the circuit design to determine whether the possible noise fault for each identified timing interval is feasible based in part on a unified Boolean and timing representation of the victim net and the at least one aggressor net for the each identified timing interval and further in part upon a result of the determining whether an internal node will switch during the one or more timing intervals.

53. The computer implemented method of claim 41, in which the act of determining whether the satisfiability formula is satisfiable for the each identified timing interval comprises:

determining whether an internal node will switch during the one or more timing intervals by propagating a signal transition information in a unified Boolean and timing representation backward from a primary output through the internal node to a backward propagation termination point.

54. The computer implemented method of claim 53, in which the act of propagating a signal transition information backward further comprises:

pruning a first timing interval from the one or more timing intervals where the satisfiability formula is determined to be not satisfiable.

55. The computer implemented method of claim 54, in which the act of pruning a first timing interval is performed by temporal pruning.

56. The computer implemented method of claim 54, in which the act of pruning a first timing interval is performed by interval merging.

57. The computer implemented method of claim 54, in which the act of pruning a first timing interval is performed by exploiting an arrival switching window to prune the first time interval propagated backward.

58. A system for eliminating false positives in crosstalk noise analysis of a circuit, comprising:

means for identifying a possible noise fault for one or more timing intervals based on a timing analysis of a victim net and at least one aggressor net of the circuit design;

means for determining a unified Boolean and timing representation of the victim net and the at least one aggressor net for each identified timing interval;

means for defining a satisfiability formula with the unified Boolean and timing representation, in which if the possible noise fault is feasible for a timing interval within the one or more timing intervals the satisfiability formula is deemed satisfiable;

means for determining whether the satisfiability formula is satisfiable for the each identified timing interval; and means for storing a result of the determining whether the satisfiability formula is satisfiable in a tangible medium.

59. The system of claim 58, in which the unified Boolean and timing representation is constructed by considering a noise delay.

60. The system of claim 59, in which the act of considering a noise delay comprises incorporating an amount of noise into consideration.

61. The system of claim 60, in which the act of considering a noise delay further comprises incorporating worst-case noise propagation.

62. The system of claim 61, in which the worst-case noise propagation comprises incorporating a worst-case noise value into a pin-to-output delay.

63. The system of claim 61, further comprising:

means for identifying a critical part of the circuit design;

means for constructing the unified Boolean and timing representation by considering the amount of noise in the critical part of the circuit design; and means for constructing the unified Boolean and timing representation by considering the worst-case noise propagation in another part of the circuit design.

64. The system of claim 58, in which the means for determining whether the satisfiability formula is satisfiable comprises:

means for determining whether an internal node will switch during the one or more timing intervals by propagating a signal transition information in a unified Boolean and timing representation backward from a primary output through the internal node to a backward propagation termination point.

65. The system of claim 64, in which the signal transition information comprises a timing information and a functionality information.

66. The system of claim 58, in which the means for determining whether the satisfiability formula is satisfiable for the each identified timing interval comprises:

means for determining whether an internal node will switch during the one or more timing intervals by propagating a signal transition information in a unified Boolean and timing representation backward from a primary output through the internal node to a backward propagation termination point.

67. The system of claim 66, in which a means for determining by propagating a signal transition information backward further comprises:

means for pruning a first timing interval from the one or more timing intervals where the satisfiability formula is determined to be not satisfiable.

68. The system of claim 66, in which the backward propagation termination point comprises a primary input or a register output.

69. The system of claim 58, in which a means for propagating a signal transition information backward is performed at the victim net and the at least one aggressor net.

70. The system of claim 58, further comprising:

means for identifying a primary output, a backward propagation termination point, and an internal node between the backward propagation termination point and the primary output; and means for analyzing a switching activity at the internal node.

71. The system of claim 58, in which the means for determining whether the satisfiability formula is satisfiable for the each identified timing interval comprises:

means for analyzing the circuit design to determine whether the possible noise fault for each identified timing interval is feasible based in part on a unified Boolean and timing representation of the victim net and the at least one aggressor net for the each identified timing interval and further in part upon a result of of determining whether an internal node will switch during the one or more timing intervals.

72. A computer program product comprising a computer usable medium having executable code to execute a process for eliminating false positives in crosstalk noise analysis of a circuit design, the process comprising:

identifying a possible noise fault for one or more timing intervals based on a timing analysis of a victim net and at least one aggressor net of the circuit design;

determining a unified Boolean and timing representation of the victim net and the at least one aggressor net for each identified timing interval;

defining a satisfiability formula with the unified Boolean and timing representation, in which if the possible noise fault is feasible for a timing interval within the one or more timing intervals the satisfiability formula is deemed satisfiable;

determining whether the satisfiability formula is satisfiable for the each identified timing interval; and storing a result of the determining whether the satisfiability formula is satisfiable in a tangible medium.

73. The computer program product of claim 72, in which the unified Boolean and timing representation is constructed by considering a noise delay.

74. The computer program product of claim 73, in which the act of considering a noise delay comprises incorporating an amount of noise into consideration.

75. The computer program product of claim 74, in which the act of considering a noise delay further comprises incorporating worst-case noise propagation.

76. The computer program product of claim 75, in which the worst-case noise propagation comprises incorporating a worst-case noise value into a pin-to-output delay.

77. The computer program product of claim 75, in which the process further comprising:

identifying a critical part of the circuit design;

constructing the unified Boolean and timing representation by considering the amount of noise in the critical part of the circuit design; and constructing the unified Boolean and timing representation by considering the worst-case noise propagation in another part of the circuit design.

78. The computer program product of claim 72, in which the act of determining whether the satisfiability formula is satisfiable for the each identified timing interval comprises:

determining whether an internal node will switch during the one or more timing intervals by propagating a signal transition information in a unified Boolean and timing representation backward from a primary output through the internal node to a backward propagation termination point.

79. The computer program product of claim 78, in which the act of propagating a signal transition information backward further comprises:

pruning a first timing interval from the one or more timing intervals where the satisfiability formula is determined to be not satisfiable.

80. The computer program product of claim 78, in which the backward propagation termination point comprises a primary input or a register output.

81. The computer program product of claim 72, in which the act of propagating a signal transition information backward is performed at the victim net and the at least one aggressor net.

82. The computer program product of claim 72, further comprising:

identifying a primary output, a backward propagation termination point, and an internal node between the backward propagation termination point and the primary output; and analyzing a switching activity at the internal node.

83. The computer program product of claim 72, in which the act of determining whether the satisfiability formula is satisfiable for the each identified timing interval comprises:

analyzing the circuit design to determine whether the possible noise fault for each identified timing interval is feasible based in part on a unified Boolean and timing representation of the victim net and the at least one aggressor net for the each identified timing interval and further in part upon a result of an act of determining whether an internal node will switch during the one or more timing intervals.

* * * * *